United States Patent
Endo et al.

(10) Patent No.: US 11,460,771 B2
(45) Date of Patent: Oct. 4, 2022

(54) PROTECTIVE FILM FORMING COMPOSITION HAVING AN ACETAL STRUCTURE

(71) Applicant: NISSAN CHEMICAL CORPORATION, Tokyo (JP)

(72) Inventors: Takafumi Endo, Toyama (JP); Yasunobu Someya, Toyama (JP); Takahiro Kishioka, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 224 days.

(21) Appl. No.: 16/955,309

(22) PCT Filed: Dec. 20, 2018

(86) PCT No.: PCT/JP2018/046898
§ 371 (c)(1),
(2) Date: Jun. 18, 2020

(87) PCT Pub. No.: WO2019/124475
PCT Pub. Date: Jun. 27, 2019

(65) Prior Publication Data
US 2020/0409260 A1    Dec. 31, 2020

(30) Foreign Application Priority Data
Dec. 22, 2017  (JP) .............................. JP2017-246143

(51) Int. Cl.
| | | |
|---|---|---|
| *G03F 7/004* | (2006.01) | |
| *G03F 7/11* | (2006.01) | |
| *G03F 7/20* | (2006.01) | |
| *H01L 21/027* | (2006.01) | |
| *H01L 21/308* | (2006.01) | |
| *C08L 29/14* | (2006.01) | |
| *C08K 5/06* | (2006.01) | |
| *C08K 5/00* | (2006.01) | |

(52) U.S. Cl.
CPC .......... *G03F 7/0045* (2013.01); *C08K 5/0025* (2013.01); *C08K 5/06* (2013.01); *C08L 29/14* (2013.01); *G03F 7/11* (2013.01); *G03F 7/20* (2013.01); *H01L 21/0274* (2013.01); *H01L 21/3081* (2013.01); *C08L 2203/16* (2013.01)

(58) Field of Classification Search
CPC . G03F 7/0045; G03F 7/11; G03F 7/20; G03F 7/094; C08K 5/0025; C08K 5/06; C08L 29/14; C08L 2203/16; H01L 21/0274; H01L 21/3081; H01L 21/0332; H01L 21/308; C09D 133/068; C08F 8/14; C08F 24/00
USPC ................. 430/270.1, 271.1, 272.1; 438/694
See application file for complete search history.

(56) References Cited

U.S. PATENT DOCUMENTS

| | | |
|---|---|---|
| 2013/0045601 A1 | 2/2013 | Ogihara et al. |
| 2016/0284559 A1* | 9/2016 | Kikuchi ............... H01L 21/3081 |
| 2022/0026806 A1* | 1/2022 | Nishita ................ C09D 133/14 |

FOREIGN PATENT DOCUMENTS

| | | | |
|---|---|---|---|
| JP | 2001-215727 A | | 8/2001 |
| JP | WO2010/104074 | * | 9/2010 |
| JP | 2013-041140 A | | 2/2013 |
| JP | 2017-107185 A | | 6/2017 |
| JP | 2017-187764 A | | 10/2017 |

OTHER PUBLICATIONS

WO2010/104074, Hamada, English Machine Translation (2010) (Year: 2010).*
Mar. 12, 2019 International Search Report issued in International Patent Application No. PCT/JP2018/046898.

* cited by examiner

*Primary Examiner* — Caleen O Sullivan
(74) *Attorney, Agent, or Firm* — Oliff PLC

(57) ABSTRACT

A protective film-forming composition which protects against a semiconductor wet etching solution, contains a solvent and a compound or polymer thereof containing at least one acetal structure in a molecule thereof, and forms a protective film exhibiting excellent resistance against a semiconductor wet etching solution during the lithographic process when producing semiconductors; a method for producing a resist pattern-equipped substrate which uses the protective film; and a method for producing a semiconductor device.

12 Claims, No Drawings

PROTECTIVE FILM FORMING COMPOSITION HAVING AN ACETAL STRUCTURE

TECHNICAL FIELD

The present invention relates to a composition for forming a protective film having excellent resistance to a wet etching liquid for semiconductor, preferably a basic aqueous hydrogen peroxide solution in a lithography process in the production of a semiconductor. In addition, the present invention relates to a method for producing a substrate having a resist pattern using the protective film, and a method for producing a semiconductor device.

BACKGROUND ART

A lithography process in the production of a semiconductor has been widely known in which a resist underlying film is formed between a substrate and a resist film formed on the substrate, forming a resist pattern having a desired form.

Patent Literature 1 discloses an antireflection coating composition which comprises a polymer having a glycidyl group and a polymer having an aromatic group substituted with, e.g., a hydroxy group, and which is used together with a photoresist formed as an overcoat, and a method in which a photoresist underlying film is formed using the antireflection coating composition, and subjected to exposure, development, and patterning.

Patent Literature 2 discloses a method which comprises applying a composition comprising a resin containing an epoxy reactive group, such as a hydroxy group, and a crosslinkable resin containing an epoxy group onto a substrate, and forming a photoresist layer on the applied composition, forming a photoresist relief.

CITATION LIST

Patent Literatures

Patent Literature 1: JP 2017-107185 A
Patent Literature 2: JP 2017-187764 A

SUMMARY OF INVENTION

Technical Problem

In the case where a resist underlying film is used as an etching mask and a substrate is processed by wet etching, the resist underlying film is required to function as an excellent mask with respect to the wet etching liquid used during processing of the substrate.

Conventionally, for obtaining a film exhibiting a resistance to SC-1 (ammonia-hydrogen peroxide solution) which is a kind of wet etching chemical liquid, a method of applying gallic acid as an additive to the film has been used.

Further, it has been known that a catechol structure exhibits an improvement effect for the resistance to a wet etching liquid for semiconductor (Patent Literatures 1 and 2), but the resistance to a wet etching liquid for semiconductor obtained using the catechol structure is not satisfactory.

An object of the present invention is to solve the above-mentioned problems.

Solution to Problem

The present invention includes the followings.

[1] A composition for forming a protective film against a wet etching liquid for semiconductor, the protective film forming composition comprising a solvent and a compound containing in the molecule thereof at least one acetal structure, or a polymer thereof.

[2] The protective film forming composition according to item [1] above, wherein the at least one acetal structure is a structure that protects adjacent hydroxy groups of an aromatic group.

[3] The protective film forming composition according to item [1] above, wherein the compound has a partial structure represented by the following formula (1):

[Chemical formula 1]

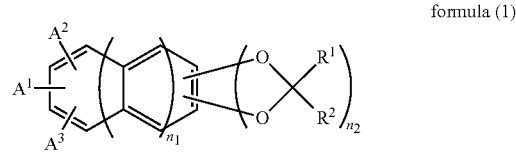

formula (1)

wherein:
each of $R^1$ and $R^2$ represents a hydrogen atom, or an alkyl group having 1 to 10 carbon atoms or an aryl group having 6 to 40 carbon atoms,
each of the groups optionally being substituted,
$n_1$ is 0, 1, or 2,
$n_2$ is 1 or 2,
$A^1$ represents a hydrogen atom or a hydroxy group,
$A^2$ represents a —CH($R^0$)-$A^4$ group,
$R^0$ represents a hydrogen atom, a phenyl group optionally substituted with 1 to 3 hydroxy groups, or a benzodioxole group, and
$A^3$ and $A^4$ are the same or different and each represents a monovalent organic group.

[4] The protective film forming composition according to item [3] above, wherein, in formula (1), $n_1$ is 0, and $n_2$ is 1.

[5] The protective film forming composition according to item [3] above, wherein, in formula (1), $R^1$ and $R^2$ are the same or different and a hydrogen atom or a methyl group.

[6] The protective film forming composition according to item [3] above, wherein, in formula (1), $R^1$ and $R^2$ are a hydrogen atom.

[7] The protective film forming composition according to any one of items [1] to [6] above, which further comprises a crosslinking catalyst.

[8] The protective film forming composition according to any one of items [1] to [7] above, which further comprises a crosslinking agent.

[9] The protective film forming composition according to any one of items [1] to [8] above, which further comprises a surfactant.

[10] A protective film which is a baked product of an applied film of the protective film forming composition according to any one of items [1] to [9] above.

[11] A method for producing a substrate having a resist pattern, comprising the steps of applying the protective film forming composition according to any one of items [1] to [9] above onto a semiconductor substrate and baking the applied composition to form a protective film as a resist underlying film, which is used for producing a semiconductor.

[12] A method for producing a semiconductor device, comprising the steps of: forming a protective film on a semiconductor substrate optionally having an inorganic film formed on the surface thereof using the composition according to any one of items [1] to [9] above for forming a protective film against a wet etching liquid for semiconductor;
forming a resist pattern on the protective film;
subjecting the protective film to dry etching using the formed resist pattern as a mask so as to expose a surface of the inorganic film or the semiconductor substrate; and
using the dry-etched protective film as a mask, subjecting the inorganic film or the semiconductor substrate to wet etching with a wet etching liquid for semiconductor and to washing.

Advantageous Effects of Invention

In the present invention, by introducing a structure in which adjacent hydroxy groups are protected by an acetal into the polymer used in the composition, the protective film formed from such a composition can exhibit a high resistance to a wet etching liquid for semiconductor.

DESCRIPTION OF EMBODIMENTS

Protective Film Forming Composition

The composition of the present invention for forming a protective film against a wet etching liquid for semiconductor comprises a solvent and a compound containing in the molecule thereof at least one acetal structure, or a polymer thereof. The components of the composition are individually described below.

Compound Containing in the Molecule Thereof at Least One Acetal Structure

It is preferred that the acetal structure is a structure that protects adjacent hydroxy groups of an aromatic group. In this case, the compound contains in the molecule thereof at least one aromatic group having adjacent hydroxy groups protected by an acetal.

The acetal structure is preferably a partial structure represented by the following formula (1):

[Chemical formula 2]

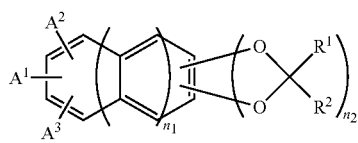

formula (1)

wherein:
each of $R^1$ and $R^2$ represents a hydrogen atom, or an alkyl group having 1 to 10 carbon atoms or an aryl group having 6 to 40 carbon atoms,
each of the groups optionally being substituted,
$n_1$ is 0, 1, or 2,
$n_2$ is 1 or 2,
$A^1$ represents a hydrogen atom or a hydroxy group,
$A^2$ represents a —CH($R^0$)-$A^4$ group,
$R^0$ represents a hydrogen atom, a phenyl group optionally substituted with 1 to 3 hydroxy groups, or a benzodioxole group, and
$A^3$ and $A^4$ are the same or different and each represents a monovalent organic group.

Examples of optionally substituted alkyl groups having 1 to 10 carbon atoms include a methyl group, an ethyl group, a n-propyl group, an i-propyl group, a cyclopropyl group, a n-butyl group, an i-butyl group, a s-butyl group, a t-butyl group, a cyclobutyl group, a 1-methyl-cyclopropyl group, a 2-methyl-cyclopropyl group, a n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, a n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

Examples of aryl groups having 6 to 40 carbon atoms include a phenyl group, an o-methylphenyl group, a m-methylphenyl group, a p-methylphenyl group, an o-chlorophenyl group, a m-chlorophenyl group, a p-chlorophenyl group, an o-fluorophenyl group, a p-fluorophenyl group, an o-methoxyphenyl group, a p-methoxyphenyl group, a p-nitrophenyl group, a p-cyanophenyl group, an α-naphthyl group, a β-naphthyl group, an o-biphenylyl group, a m-biphenylyl group, a p-biphenylyl group, a 1-anthryl group, a 2-anthryl group, a 9-anthryl group, a 1-phenanthryl group, a 2-phenanthryl group, a 3-phenanthryl group, a 4-phenanthryl group, and a 9-phenanthryl group.

Examples of substituents for the above alkyl groups and aryl groups include halogen atoms (fluorine, chlorine, bromine, and iodine), a nitro group, a cyano group, an amino group, a hydroxy group, a carbonyl group, and a carbonyloxy group, but the substituent is not limited to these.

In formula (1), it is preferred that $n_1$ is 0, and $n_2$ is 1.

In formula (1), it is preferred that $R^1$ and $R^2$ are the same or different and a hydrogen atom or a methyl group. It is more preferred that $R^1$ and $R^2$ are a hydrogen atom.

Monovalent Organic Group

With respect to the monovalent organic group, there is no particular limitation. The monovalent organic group may be one which is derived from a polymer or an oligomer, or one which is derived from a low-molecular weight compound. The monovalent organic group may be one which is derived from a compound represented by formula (1). Particularly, when $A^4$ indicates a compound represented by formula (1), the structure means an oligomer or a polymer having the same or different compounds represented by formula (1), which are linked through a —CH($R^0$)— group.

Monovalent Organic Group Derived From a Polymer

By employing an organic group derived from a polymer, it is possible to control, for example, the dry etching rate (reduction of the film thickness per unit time), attenuation coefficient, and refractive index of a resist underlying film formed from the protective film forming composition of the present invention.

With respect to the polymer, there is no particular limitation, and various types of organic polymers may be used. For example, an addition polymerization polymer, a polycondensation polymer, or a ring-opening polymerization polymer, such as a polyester, a polystyrene, a polyimide, an acrylic polymer, a methacrylic polymer, a polyvinyl ether, a phenolic novolak, a naphthol novolak, a polyether, a polyamide, or a polycarbonate, may be used.

Examples of such organic polymers include addition polymerization polymers comprising, as structural units, an addition-polymerizable monomer, such as benzyl acrylate, benzyl methacrylate, phenyl acrylate, naphthyl acrylate, anthryl methacrylate, anthrylmethyl methacrylate, styrene, hydroxystyrene, benzyl vinyl ether, or N-phenylmaleimide, and polycondensation polymers, such as a phenolic novolak and a naphthol novolak.

When an addition polymerization polymer is used as the above-mentioned organic polymer, the polymer may be either a homopolymer or a copolymer. In the production of an addition polymerization polymer, an addition-polymerizable monomer is used. Examples of the addition-polymerizable monomers include acrylic acid, methacrylic acid, an acrylate compound, a methacrylate compound, an acrylamide compound, a methacrylamide compound, a vinyl compound, a styrene compound, a maleimide compound, maleic anhydride, and acrylonitrile.

Examples of the acrylate compounds include methyl acrylate, ethyl acrylate, normalhexyl acrylate, isopropyl acrylate, cyclohexyl acrylate, benzyl acrylate, phenyl acrylate, anthrylmethyl acrylate, 2-hydroxyethyl acrylate, 3-chloro-2-hydroxypropyl acrylate, 2-hydroxypropyl acrylate, 2,2,2-trifluoroethyl acrylate, 2,2,2-trichloroethyl acrylate, 2-bromoethyl acrylate, 4-hydroxybutyl acrylate, 2-methoxyethyl acrylate, tetrahydrofurfuryl acrylate, 2-methyl-2-adamantyl acrylate, 5-acryloyloxy-6-hydroxynorbornene-2-carboxylic-6-lactone, 3-acryloxypropyltriethoxysilane, and glycidyl acrylate.

Examples of the methacrylate compounds include methyl methacrylate, ethyl methacrylate, normalhexyl methacrylate, isopropyl methacrylate, cyclohexyl methacrylate, benzyl methacrylate, phenyl methacrylate, anthrylmethyl methacrylate, 2-hydroxyethyl methacrylate, 2-hydroxypropyl methacrylate, 2,2,2-trifluoroethyl methacrylate, 2,2,2-trichloroethyl methacrylate, 2-bromoethyl methacrylate, 4-hydroxybutyl methacrylate, 2-methoxyethyl methacrylate, tetrahydrofurfuryl methacrylate, 2-methyl-2-adamantyl methacrylate, 5-methacryloyloxy-6-hydroxynorbornene-2-carboxylic-6-lactone, 3-methacryloxypropyltriethoxysilane, glycidyl methacrylate, 2-phenylethyl methacrylate, hydroxyphenyl methacrylate, and bromophenyl methacrylate.

Examples of the acrylamide compounds include acrylamide, N-methylacrylamide, N-ethylacrylamide, N-benzylacrylamide, N-phenylacrylamide, N,N-dimethylacrylamide, and N-anthrylacrylamide.

Examples of the methacrylamide compounds include methacrylamide, N-methylmethacrylamide, N-ethylmethacrylamide, N-benzylmethacrylamide, N-phenylmethacrylamide, N,N-dimethylmethacrylamide, and N-anthrylacrylamide.

Examples of the vinyl compounds include vinyl alcohol, 2-hydroxyethyl vinyl ether, methyl vinyl ether, ethyl vinyl ether, benzyl vinyl ether, vinyl acetate, vinyltrimethoxysilane, 2-chloroethyl vinyl ether, 2-methoxyethyl vinyl ether, vinylnaphthalene, and vinylanthracene.

Examples of the styrene compounds include styrene, hydroxystyrene, chlorostyrene, bromostyrene, methoxystyrene, cyanostyrene, and acetylstyrene.

Examples of the maleimide compounds include maleimide, N-methylmaleimide, N-phenylmaleimide, N-cyclohexylmaleimide, N-benzylmaleimide, and N-hydroxyethylmaleimide.

When a polycondensation polymer is used as the polymer, examples of such polymers include polycondensation polymers of a glycol compound and a dicarboxylic acid compound.

Examples of the glycol compounds include diethylene glycol, hexamethylene glycol, and butylene glycol.

Examples of the dicarboxylic acid compounds include aliphatic dicarboxylic acids and aromatic dicarboxylic acids, such as succinic acid, 2,2-dimethylsuccinic acid, adipic acid, terephthalic acid, isophthalic acid, phthalic acid, 3,3'-dithiodipropionic acid, tartaric acid, malic acid, and maleic anhydride.

Further examples include polyesters, polyamides, and polyimides, such as polypyromellitimide, poly(p-phenyleneterephthalamide), polybutylene terephthalate, and polyethylene terephthalate.

When a ring-opening polymerization polymer is used as the polymer, examples of such polymers include polycondensation polymers of a diepoxy compound and a dicarboxylic acid compound.

Examples of diepoxy compounds include compounds, such as sorbitol polyglycidyl ether, polyglycerol polyglycidyl ether, pentaerythritol polyglycidyl ether, diglycerol polyglycidyl ether, glycerol polyglycidyl ether, trimethylolpropane polyglycidyl ether, neopentyl glycol diglycidyl ether, 1,6-hexanediol diglycidyl ether, and compounds represented by the following formulae [3-1] to [3-16]:

[Chemical formula 3-1]

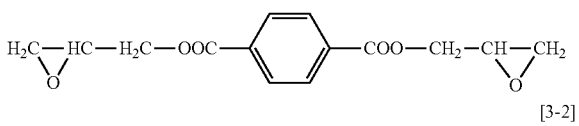

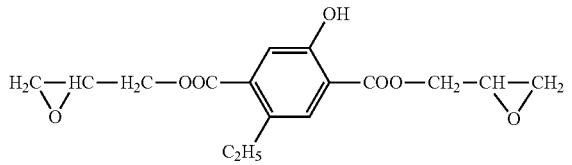

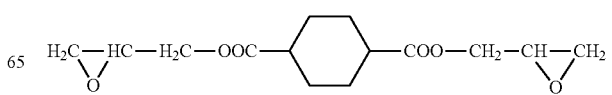

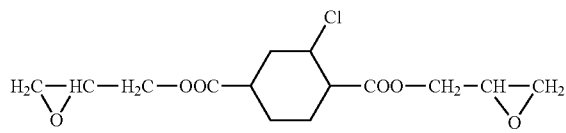

[3-4]

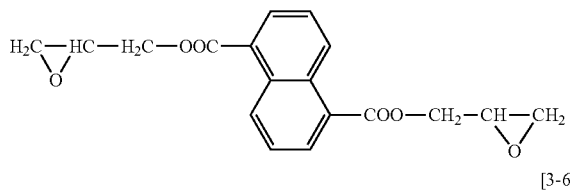

[3-5]

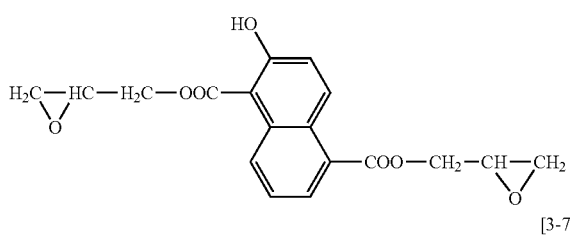

[3-6]

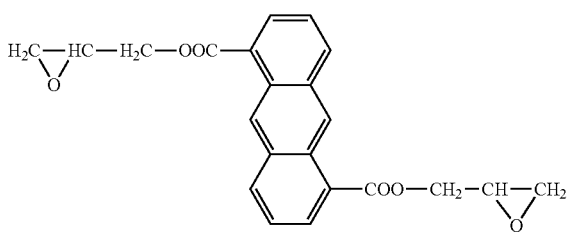

[3-7]

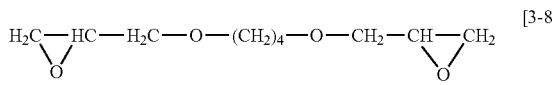

[3-8]

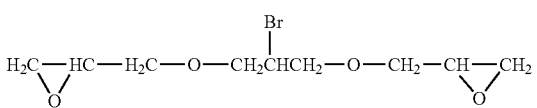

[3-9]

[Chemical formula 3-2]

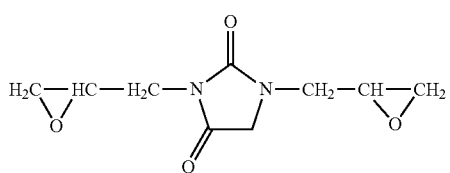

[3-10]

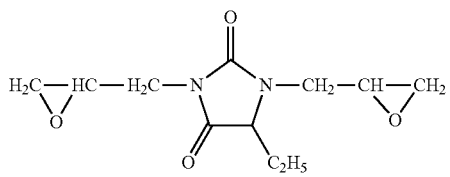

[3-11]

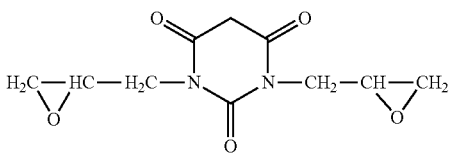

[3-12]

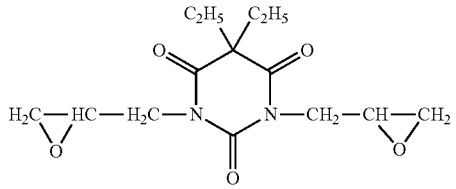

[3-13]

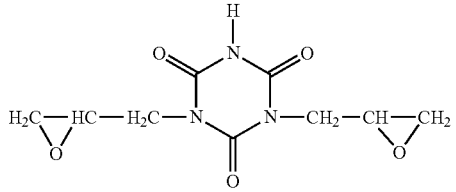

[3-14]

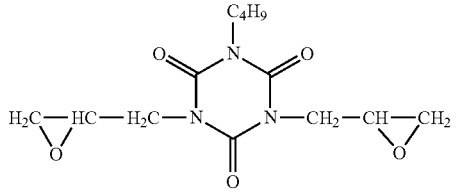

[3-15]

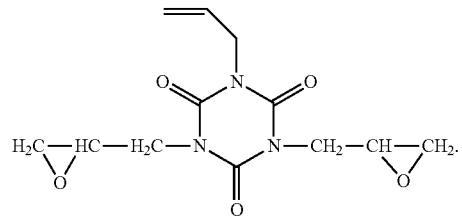

[3-16]

Examples of the dicarboxylic acid compounds include the above-mentioned dicarboxylic acid compounds.

With respect to the polymer, there may be used a polymer having a weight average molecular weight of, for example, 1,000 to 100,000, or 1,500 to 50,000, or 2,000 to 30,000, or 3,000 to 20,000.

The polymer is preferably one having a structure of the following formula (10):

[Chemical formula 4]

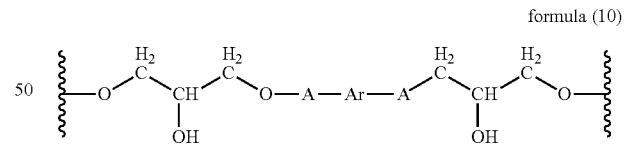

formula (10)

wherein A represents a direct bond or —C(=O)—, and Ar represents a benzene ring, a naphthalene ring, or an anthracene ring, which is optionally substituted with an alkyl group having 1 to 6 carbon atoms, a halogen atom, a hydroxy group, a carboxyl group, an amino group, an alkoxy group having 1 to 6 carbon atoms, an alkylthio group having 1 to 6 carbon atoms, a cyano group, an acetyl group, an acetyloxy group, an alkoxycarbonyl group having 1 to 6 carbon atoms, a nitro group, a nitroso group, an amide group, an imide group, an alkoxysulfonyl group having 1 to 6 carbon atoms, or a sulfonamide group.

Examples of alkyl groups in formula (10) include a methyl group, an ethyl group, a n-butyl group, a t-butyl group, an isopropyl group, and a cyclohexyl group, examples of halogen atoms include a fluorine atom, a chlorine atom, a bromine atom, and an iodine atom, examples of alkoxy groups include a methoxy group, an ethoxy group, and a butoxy group, examples of alkylthio groups include a methylthio group, an ethylthio group, and a butylthio group, examples of alkoxycarbonyl groups include a methoxycarbonyl group, an ethoxycarbonyl group, and an isopropoxycarbonyl group, and examples of alkoxysulfonyl groups include a methoxysulfonyl group and an ethoxysulfonyl group.

The polymer may be produced by, for example, the method described in Japanese Patent No. 5041175.

Monovalent Organic Group Derived From a Low-Molecular Weight Compound

With respect to the low-molecular weight compound from which the monovalent organic group is derived, there is no particular limitation, but, considering a risk of volatilization of the compound during the baking, preferred is a compound having a molecular weight of 300 or more. The upper limit of the molecular weight of the compound is, for example, 999. Specific preferred examples of the compounds are shown below. Symbol * indicates a bonding site.

[Chemical formula 5]

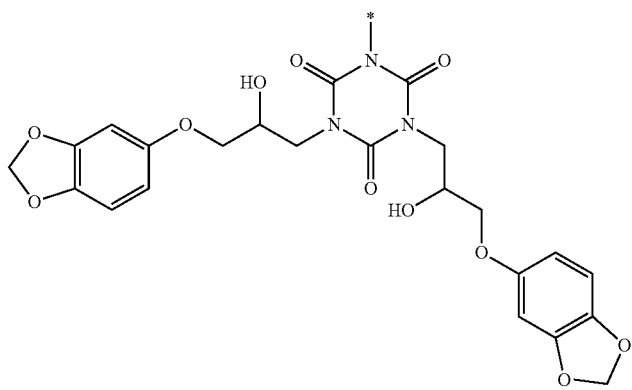

[Chemical formula 6]

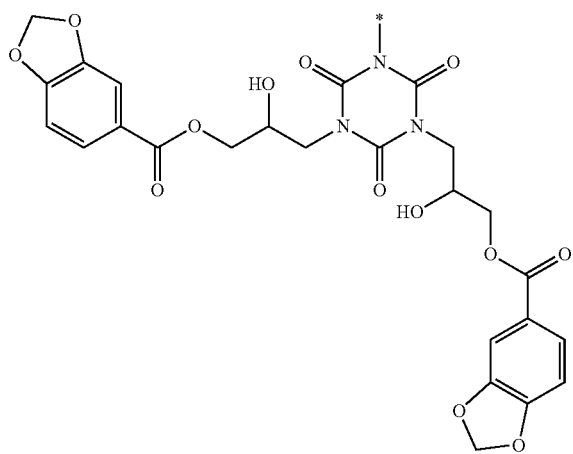

[Chemical formula 7]
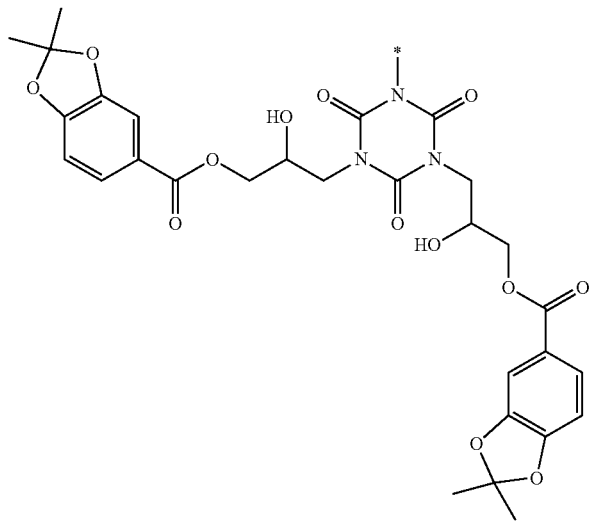
[Chemical formula 8]
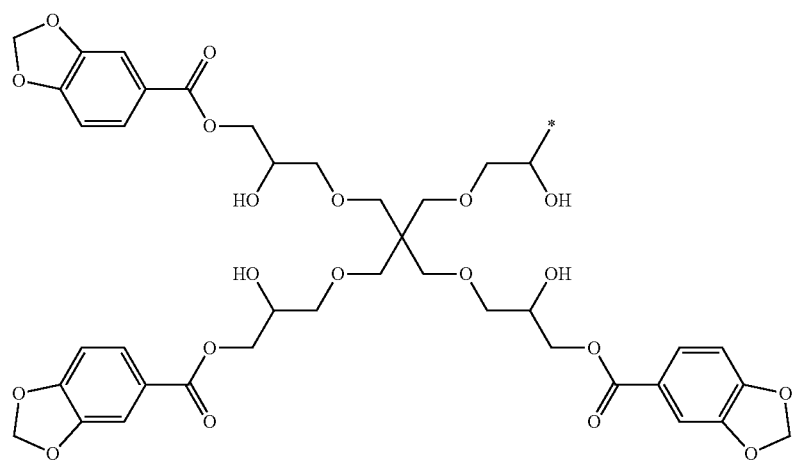
[Chemical formula 9]
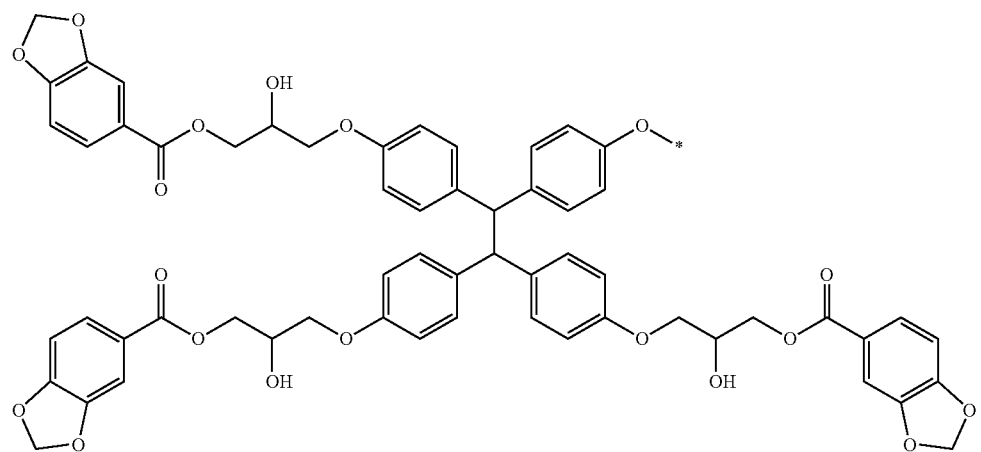

[Chemical formula 10]

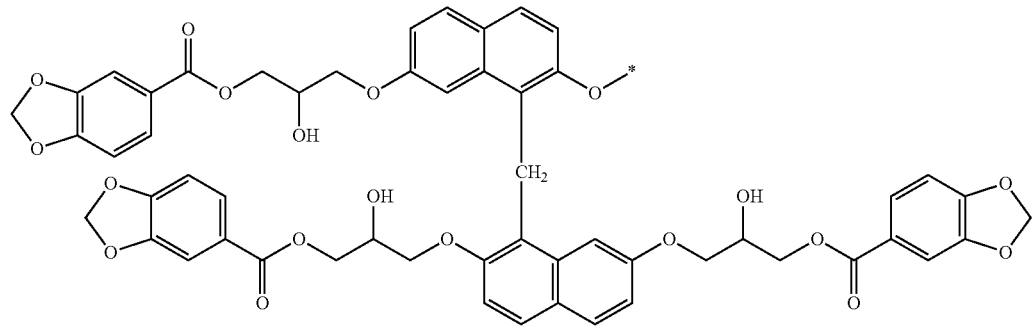

Further, the monovalent organic group may be one derived from the above-mentioned low-molecular weight compound having a spacer added thereto.

Examples of spacers include —CH—, —(CH$_2$)$_n$— (n=1 to 20), —CH=CH—, —CH≡CH—, —N=N—, —NH—, —NHR—, —NHCO—, —NRCO—, —S—, —COO—, —O—, —CO—, —CH=N—, —CH(OH)—, and phenylene and a combination thereof. Two or more spacers may be linked together.

Specific Preferred Examples of the Compound Having a Partial Structure Represented by Formula (1)

Preferred examples of the compound having a partial structure represented by formula (1) are as shown below.

The polymer having a partial structure represented by formula (1) includes structural units represented by the following formulae (A-1) to (A-6).

[Chemical formula 11]

formula(A-1)

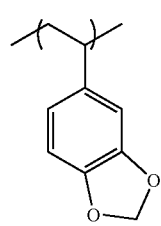

formula(A-2)

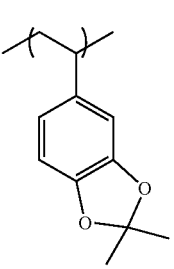

-continued formula(A-3)

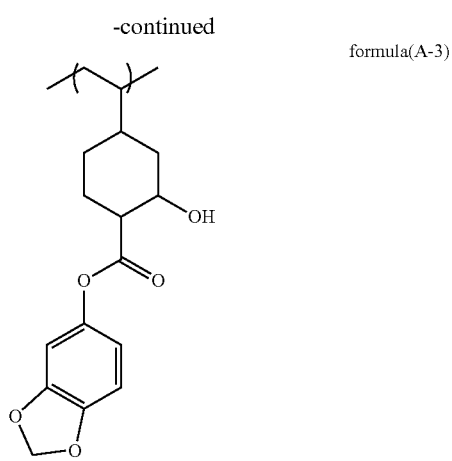

formula(A-4)

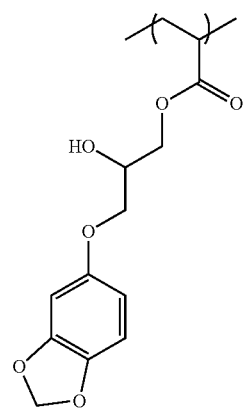

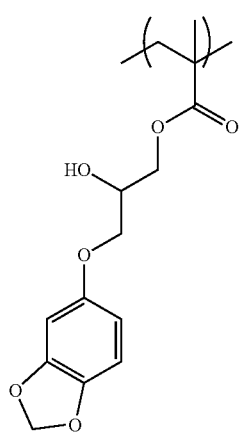
formula(A-5)
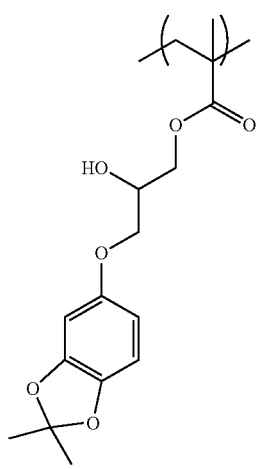
formula(A-6)
The polymer having a partial structure represented by formula (1) may be a copolymer further having structural units represented by the following formulae (A-7) to (A-18).
[Chemical Formula 12]
formula(A-7)
formula(A-8)
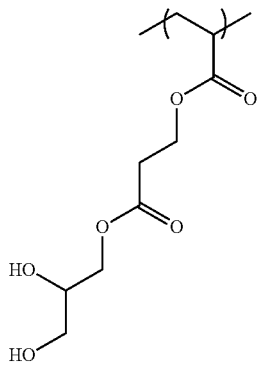
formula(A-9)
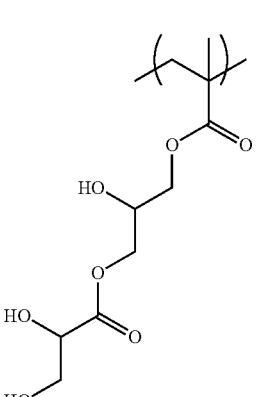
formula(A-10)
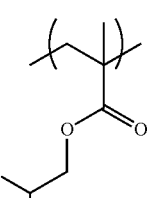
formula(A-11)
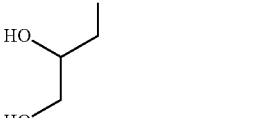
formula(A-12)
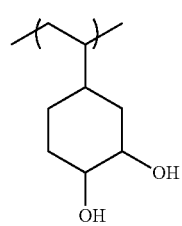

-continued formula(A-13)
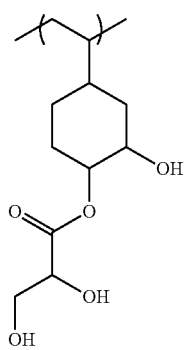

formula(A-14)
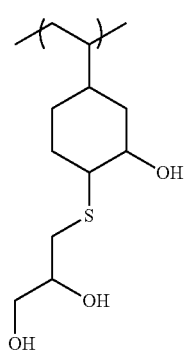

formula(A-15)
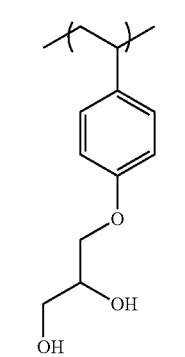

formula(A-16)
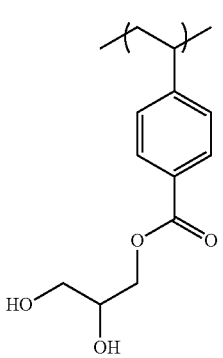

formula(A-17)
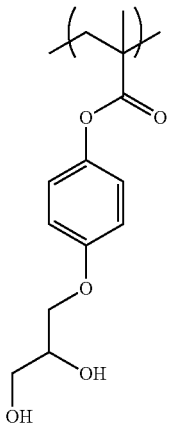

formula(A-18)
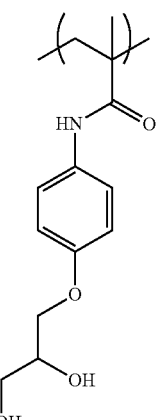

The molar ratio of the unit structure having a partial structure of formula (1) to the whole of the polymer having a partial structure represented by formula (1) is 1 to 100% by mole, preferably 10 to 100% by mole. With respect to the unit structure having a partial structure represented by formula (1), one type of or two or more types of the unit structures may be used.

When the polymer is a copolymer having a unit structure having a partial structure represented by the formula other than formula (1), the molar ratio of such a unit structure corresponds to the molar ratio of the portion remaining after removing the portion of the unit structure having a partial structure represented by formula (1) to the whole of the copolymer, and, with respect to the unit structure having a partial structure represented by the formula other than formula (1), one type of or two or more types of the unit structures may be used.

Further, examples of the compound or polymer having a partial structure represented by formula (1) above include a reaction product (D) obtained from an epoxy compound or resin represented by formula (B) below and a proton generating compound having a partial structure represented by formula (1) above and being represented by formula (C) below.

Examples of epoxy compounds (B) include a glycidyl ether compound, a glycidyl ester compound, a glycidyl group-containing isocyanurate, an epoxycyclohexyl compound, an epoxy group-substituted cyclohexyl compound, and resins thereof. Examples of epoxy compounds (B) used in the present invention include the followings.

[Chemical formula 13]
formula (B-1)
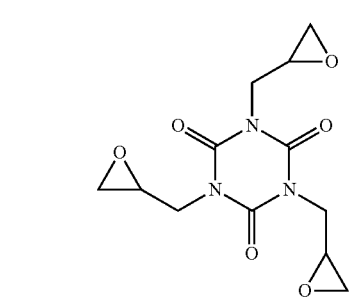
formula (B-2)
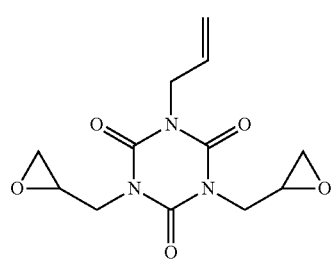
formula (B-3)
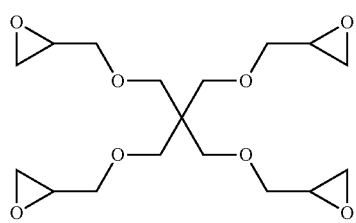
formula (B-4)
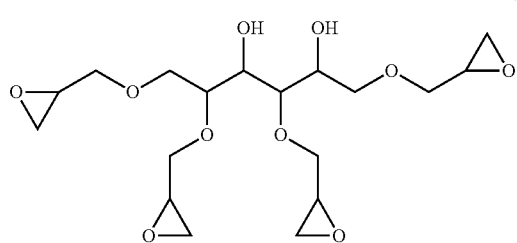
formula (B-5)
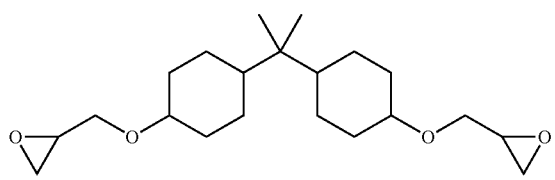
formula (B-6)
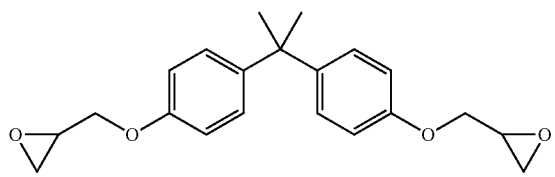
-continued
formula (B-7)
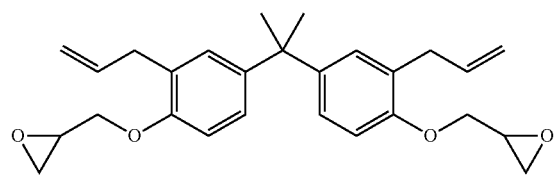
formula (B-8)
formula (B-9)
formula (B-10)
formula (B-11)
formula (B-12)

-continued
formula (B-13)
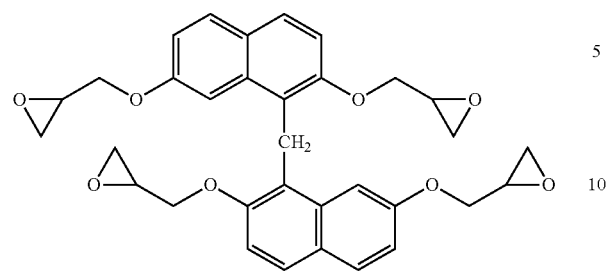
formula (B-14)
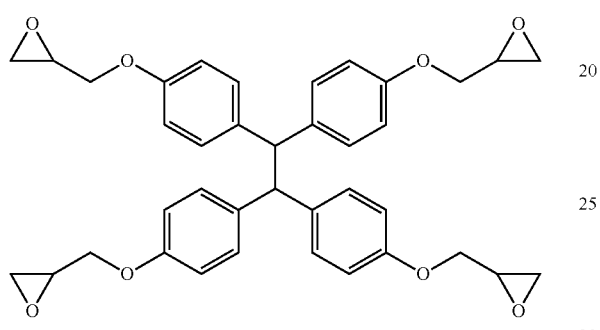
formula (B-15)
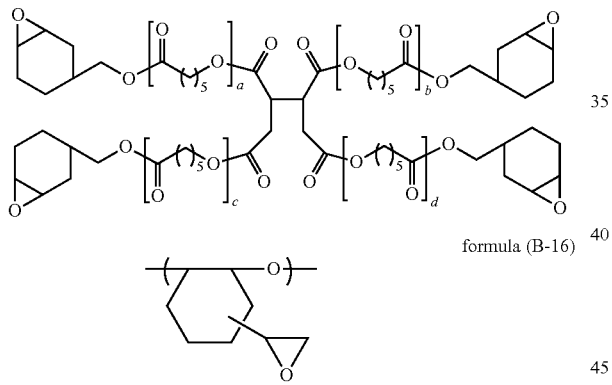
formula (B-16)
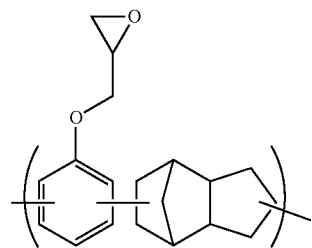
formula (B-17)
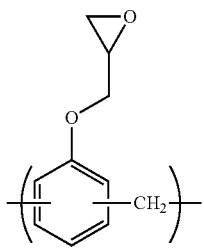
formula (B-18)
formula (B-19)
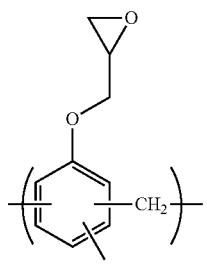
formula (B-20)
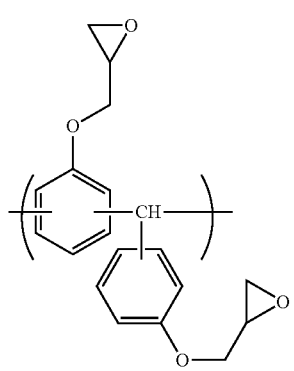
formula (B-21)
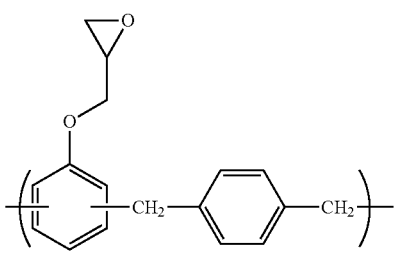
formula (B-22)
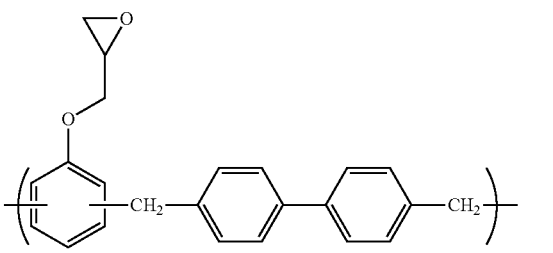
formula (B-23)
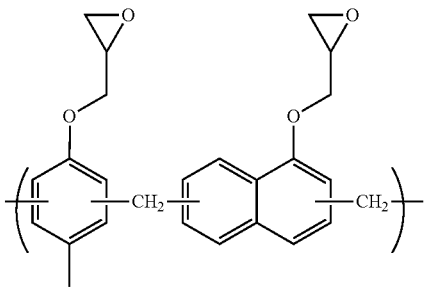

formula (B-24)

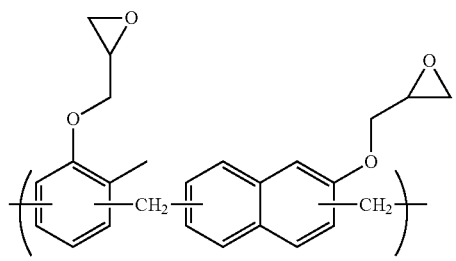

formula (B-25)

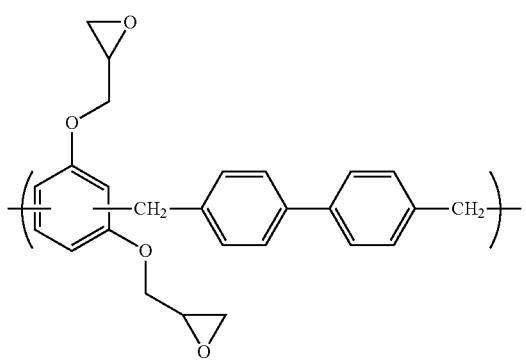

formula (B-26)

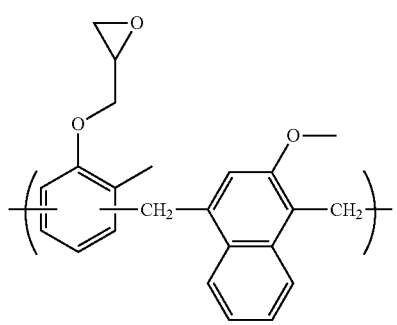

formula (B-27)

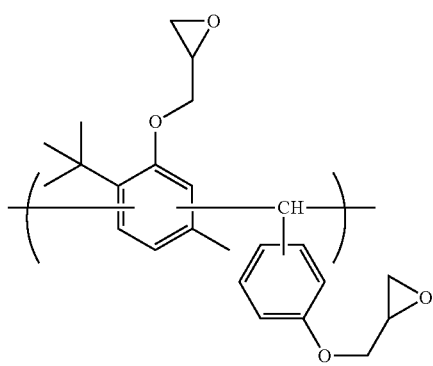

formula (B-28)

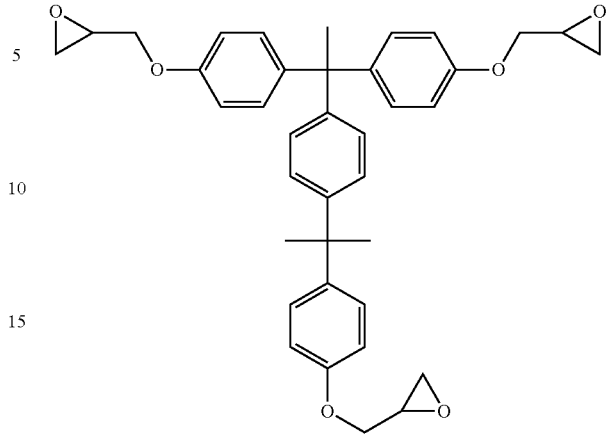

The compound of formula (B-1) is available under the trade name: TEPIC-SS, manufactured by Nissan Chemical Corporation.

The compound of formula (B-2) is available under the trade name: MA-DGIC, manufactured by Shikoku Chemicals Corporation.

The compound of formula (B-3) is available under the trade name: EX-411, manufactured by Nagase Chemtex Corporation.

The compound of formula (B-4) is available under the trade name: EX-521, manufactured by Nagase Chemtex Corporation.

The compound of formula (B-7) is available under the trade name: RE-810NM, manufactured by Nippon Kayaku Co., Ltd.

The compound of formula (B-8) is available under the trade name: BATG, manufactured by Showa Denko K.K.

The compound of formula (B-9) is available under the trade name: EX-711, manufactured by Nagase Chemtex Corporation.

The compound of formula (B-10) is available under the trade name: YD-4032D, manufactured by DIC Corporation.

The compound of formula (B-11) is available under the trade name: HP-4770, manufactured by DIC Corporation.

The compound of formula (B-12) is available under the trade name: YH-434L, manufactured by Nippon Steel & Sumikin Chemical Co., Ltd.

The compound of formula (B-13) is available under the trade name: EPICLON HP-4700, manufactured by DIC Corporation.

The compound of formula (B-14) is available under the trade name: TEP-G, manufactured by Asahi Yukizai Corporation.

The compound of formula (B-15) is trade name: Epolead GT401, manufactured by Daicel Corporation, wherein each of a, b, c, and d is 0 or 1, and a+b+c+d=1.

The compound of formula (B-16) is available under the trade name: EHPE-3150, manufactured by Daicel Corporation.

The compound of formula (B-17) is available under the trade name: HP-7200L, manufactured by DIC Corporation.

The compound of formula (B-18) is available under the trade name: EPPN-201, manufactured by Nippon Kayaku Co., Ltd.

The compound of formula (B-19) is available under the trade name: ECN-1229, manufactured by Asahi Kasei Epoxy Co., Ltd.

The compound of formula (B-20) is available under the trade name: EPPN-501H, manufactured by Nippon Kayaku Co., Ltd.

The compound of formula (B-21) is available under the trade name: NC-2000L, manufactured by Nippon Kayaku Co., Ltd.

The compound of formula (B-22) is available under the trade name: NC-3000L, manufactured by Nippon Kayaku Co., Ltd.

The compound of formula (B-23) is available under the trade name: NC-7000L, manufactured by Nippon Kayaku Co., Ltd.

The compound of formula (B-24) is available under the trade name: NC-7300L, manufactured by Nippon Kayaku Co., Ltd.

The compound of formula (B-25) is available under the trade name: NC-3500, manufactured by Nippon Kayaku Co., Ltd.

The compound of formula (B-26) is available under the trade name: EPICLON HP-5000, manufactured by DIC Corporation.

The compound of formula (B-27) is available under the trade name: FAE-2500, manufactured by Nippon Kayaku Co., Ltd.

The compound of formula (B-28) is available under the trade name: NC-6000, manufactured by Nippon Kayaku Co., Ltd.

Examples of proton generating compounds (C) having a partial structure represented by formula (1) above include the followings. Preferred is 5-hydroxy-1,3-benzodioxole (sesamol) or piperonylic acid.

[Chemical formula 14]

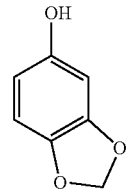

formula(C-1)

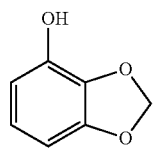

formula(C-2)

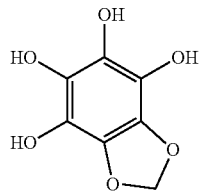

formula(C-3)

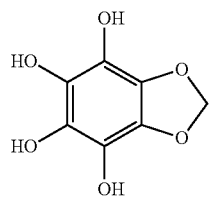

formula(C-4)

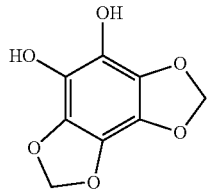

formula(C-5)

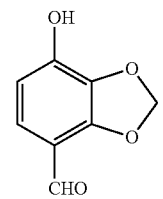

formula(C-6)

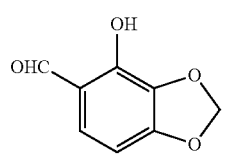

formula(C-7)

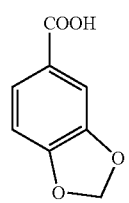

formula(C-8)

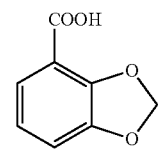

formula(C-9)

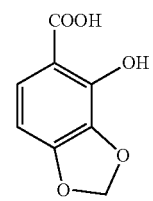

formula(C-10)

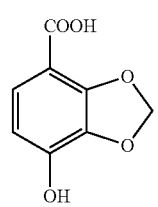

formula(C-11)

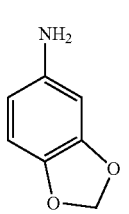

formula(C-12)

formula(C-13)
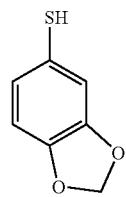
formula(C-14)
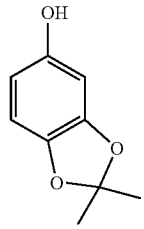
formula(C-15)
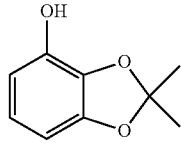
formula(C-16)
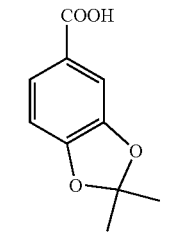
formula(C-17)
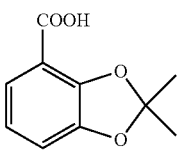
formula(C-18)
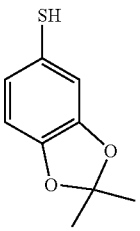
formula(C-19)
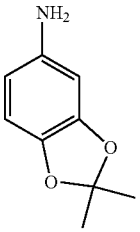
Specific examples of reaction product (D) having a partial structure represented by formula (1) above include the followings, but reaction product (D) is not limited to these compounds.
[Chemical formula 15]
formula (D-1)
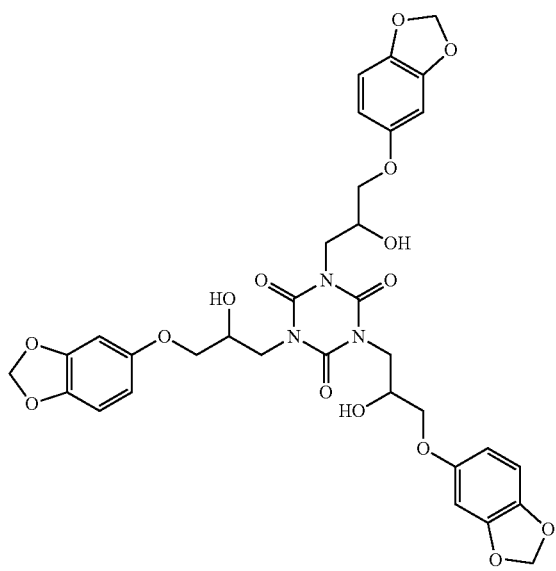
formula (D-2)
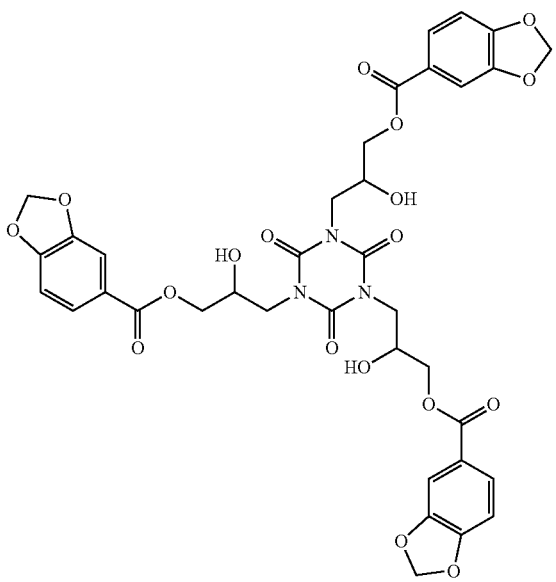

-continued
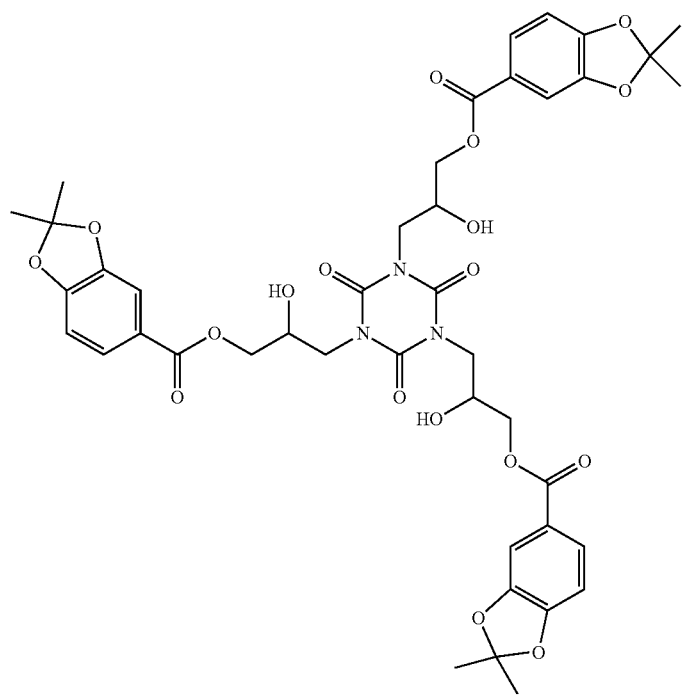
formula (D-3)
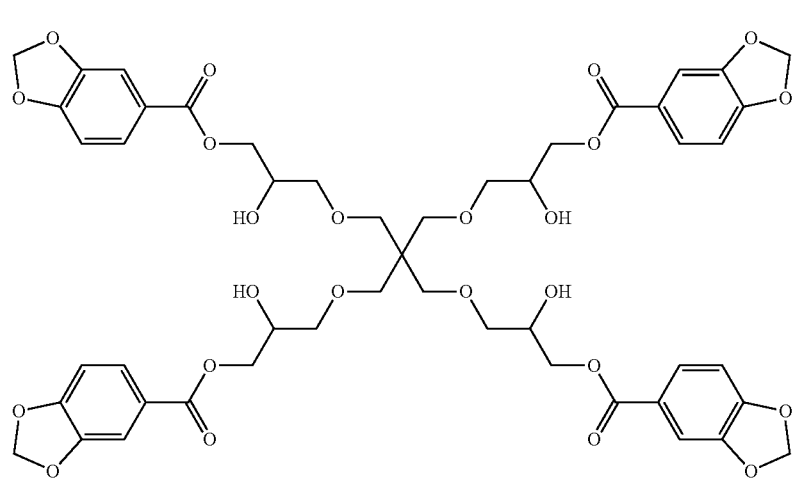
formula (D-4)
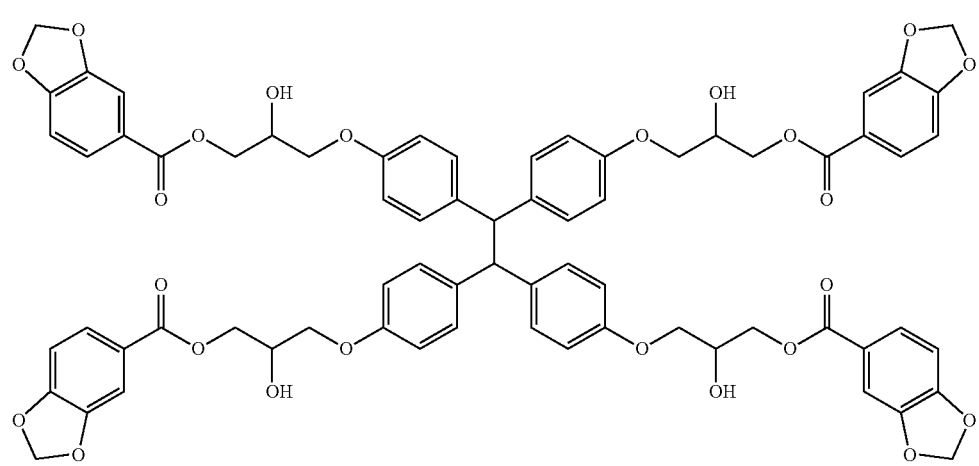
formula (D-5)

-continued
formula (D-6)
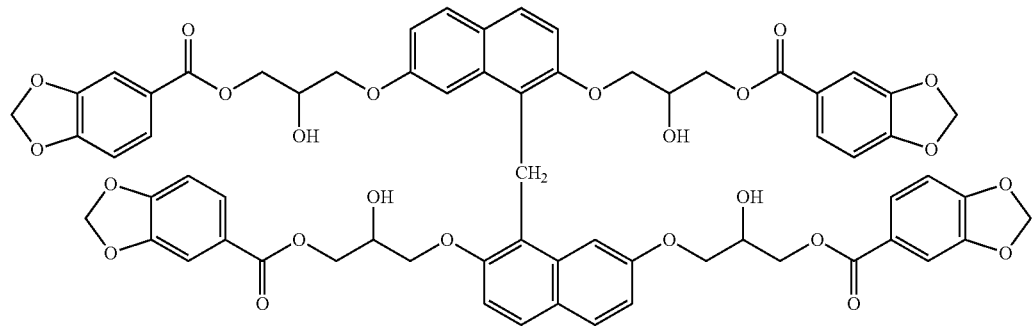
formula (D-7)
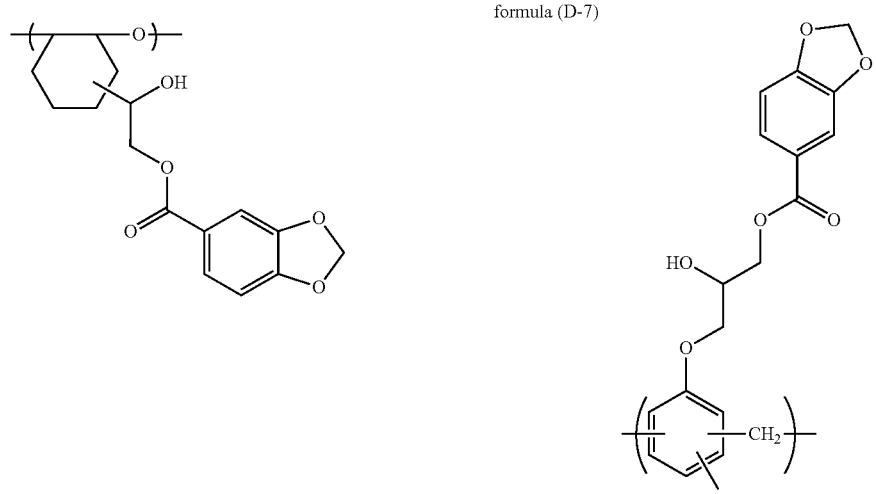
formula (D-8)
formula (D-9)
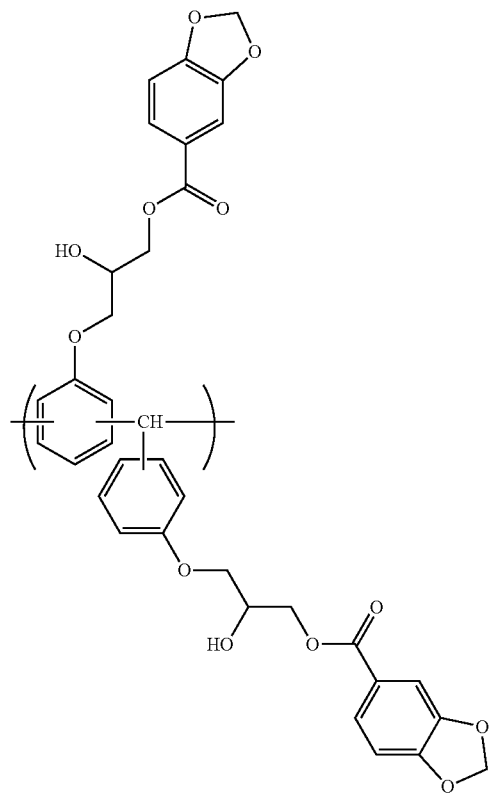

An example of the compound or polymer having a partial structure represented by formula (1) above includes a novolak resin (E) obtained from a phenolic hydroxy group-containing compound or an aromatic amine and an aldehyde having a partial structure represented by formula (1) above, or from a phenolic hydroxy group-containing compound having a partial structure represented by formula (1) above and an aldehyde.

The aldehyde having a partial structure represented by formula (1) above is preferably heliotropin (piperonal), and the phenolic hydroxy group-containing compound having a partial structure represented by formula (1) above is preferably 5-hydroxy-1,3-benzodioxole (sesamol).

Examples of reaction product (E) having a partial structure represented by formula (1) above include the followings, but reaction product (E) is not limited to these compounds.

[Chemical formula 16]

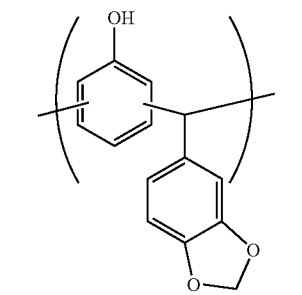

formula (E-1)

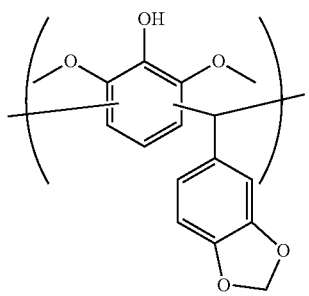

formula (E-2)

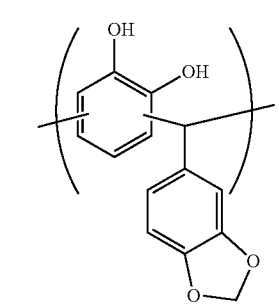

formula (E-3)

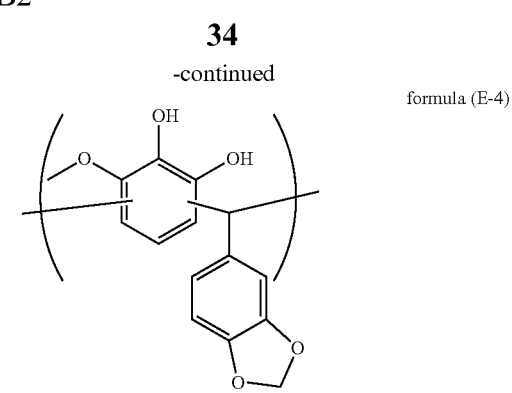

formula (E-4)

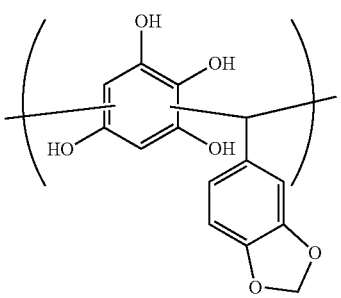

formula (E-5)

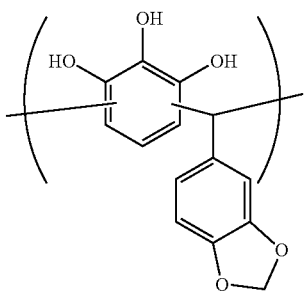

formula (E-6)

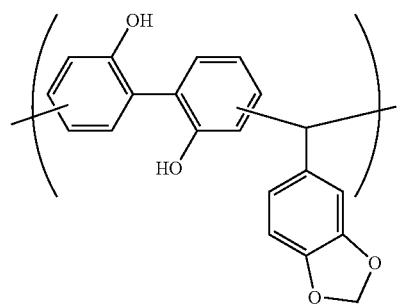

formula (E-7)

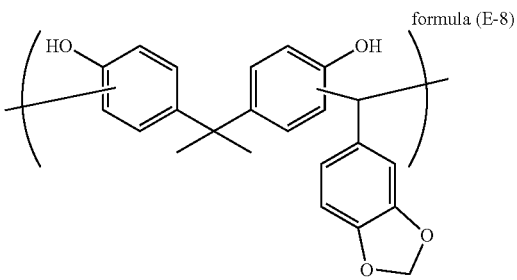

formula (E-8)

formula (E-9)
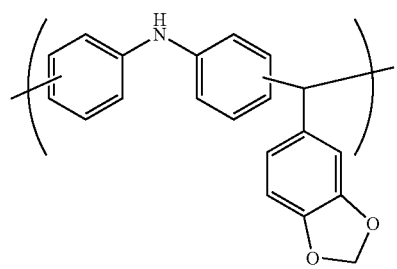
formula (E-10)
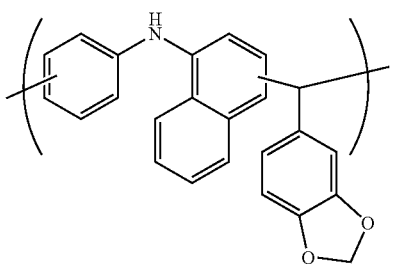
formula (E-11)
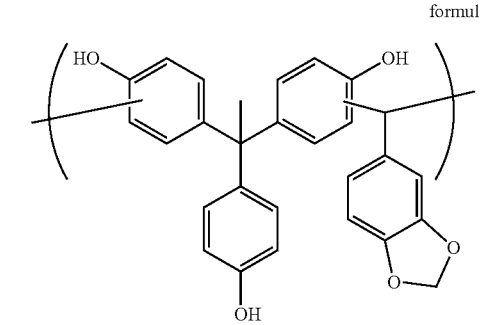
formula (E-12)
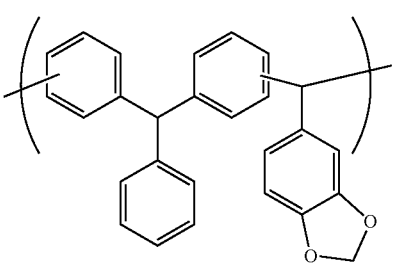
[Chemical formula 17]
formula (E-13)
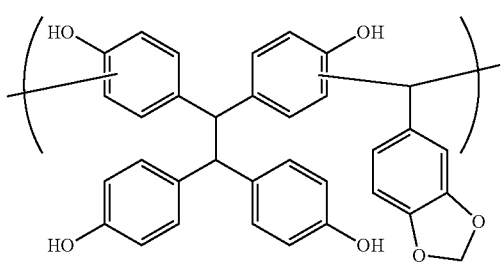
formula (E-14)
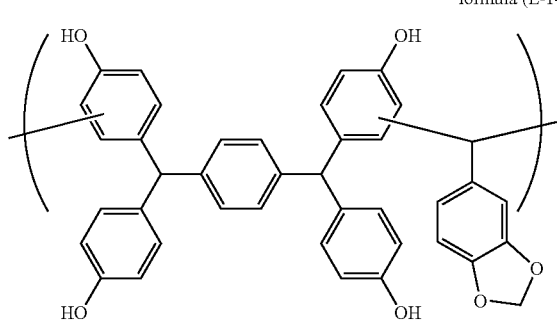
formula (E-15)
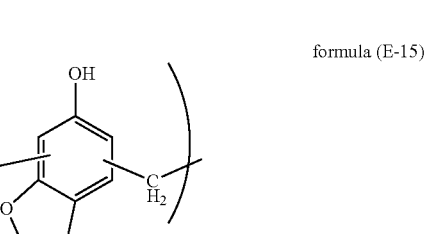
formula (E-16)
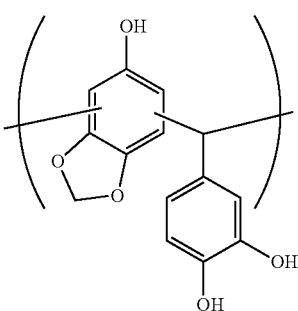
formula (E-17)
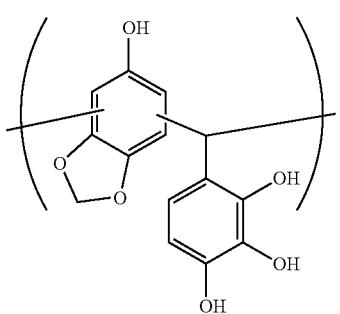
formula (E-18)

formula (E-19)

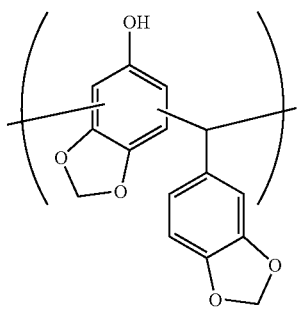

Crosslinking Agent

The resist underlying film forming composition of the present invention may contain a crosslinking agent component. Examples of the crosslinking agents include those of a type of melamine, substituted urea, or a polymer thereof. Preferred is a crosslinking agent having at least two crosslinking forming substituents, and examples include compounds, such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, and methoxymethylated thiourea. Further, a condensation product of the above compound may be used.

As the crosslinking agent, a crosslinking agent having a high heat resistance may be used. With respect to the crosslinking agent having a high heat resistance, a compound containing in the molecule thereof a crosslinking forming substituent having an aromatic ring (for example, a benzene ring or a naphthalene ring) may be used.

Examples of the compounds include compounds having a partial structure of formula (5-1) below, and polymers or oligomers having repeating units of formula (5-2) below.

[Chemical formula 18]

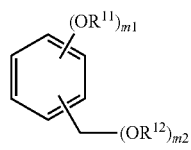

formula(5-1)

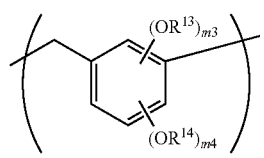

formula(5-2)

The above-mentioned $R^{11}$, $R^{12}$, $R^{13}$ and $R^{14}$ are a hydrogen atom or an alkyl group having 1 to 10 carbon atoms, and, with respect to the alkyl group, those mentioned above as examples of alkyl groups may be used.

m1 satisfies the relationship: $1 \leq m1 \leq 6-m2$, m2 satisfies the relationship: $1 \leq m2 \leq 5$, m3 satisfies the relationship: $1 \leq m3 \leq 4-m2$, and m4 satisfies the relationship: $1 \leq m4 \leq 3$.

Examples of the compounds, polymers, and oligomers of the formulae (5-1) and (5-2) are shown below.

[Chemical formula 19]

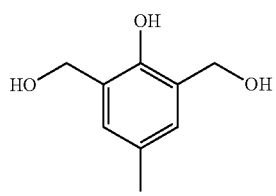

formula (6-1)

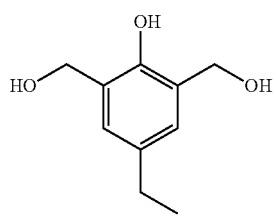

formula (6-2)

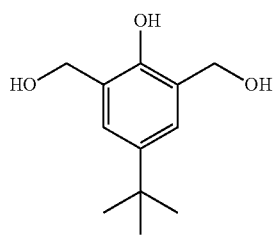

formula (6-3)

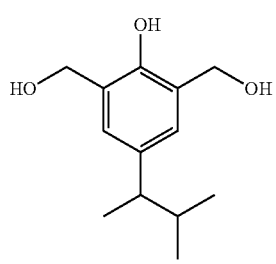

formula (6-4)

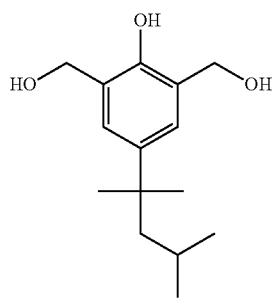

formula (6-5)

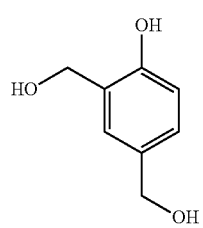

formula (6-6)

formula (6-6)
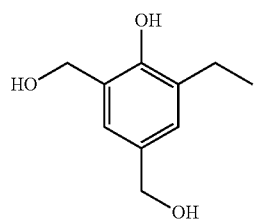
formula (6-7)
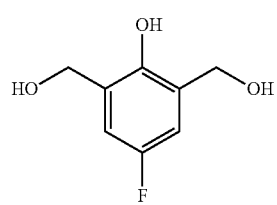
formula (6-8)
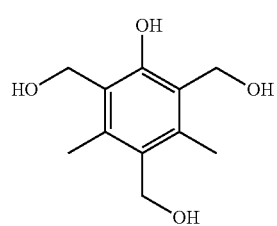
formula (6-9)
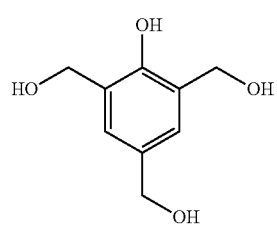
formula (6-10)
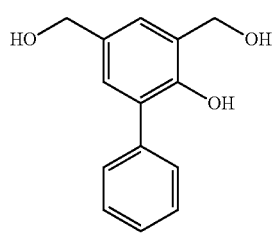
formula (6-11)
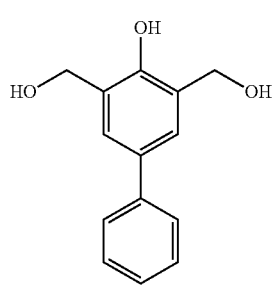
formula (6-12)
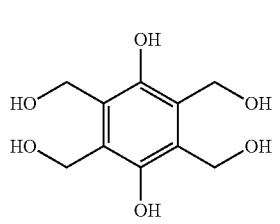
formula (6-13)
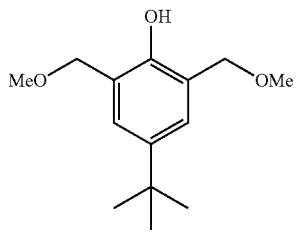
formula (6-14)
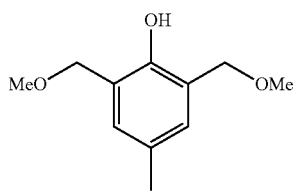
[Chemical formula 20]
formula (6-15)
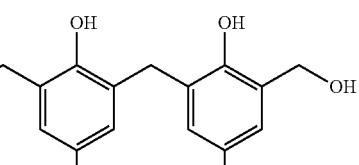
formula (6-16)
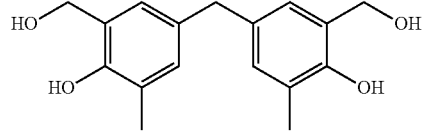
formula (6-17)
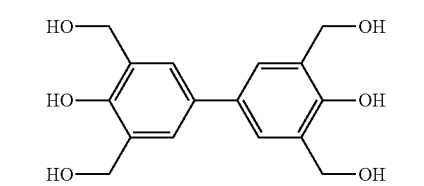
formula (6-18)
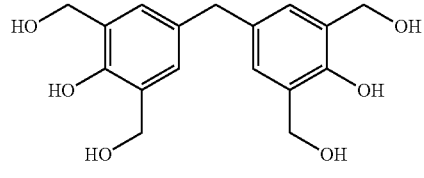
formula (6-19)
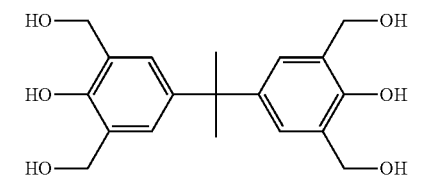
formula (6-20)
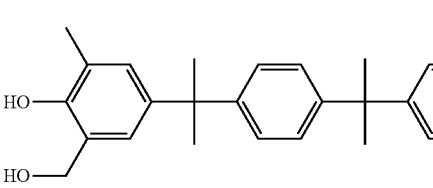

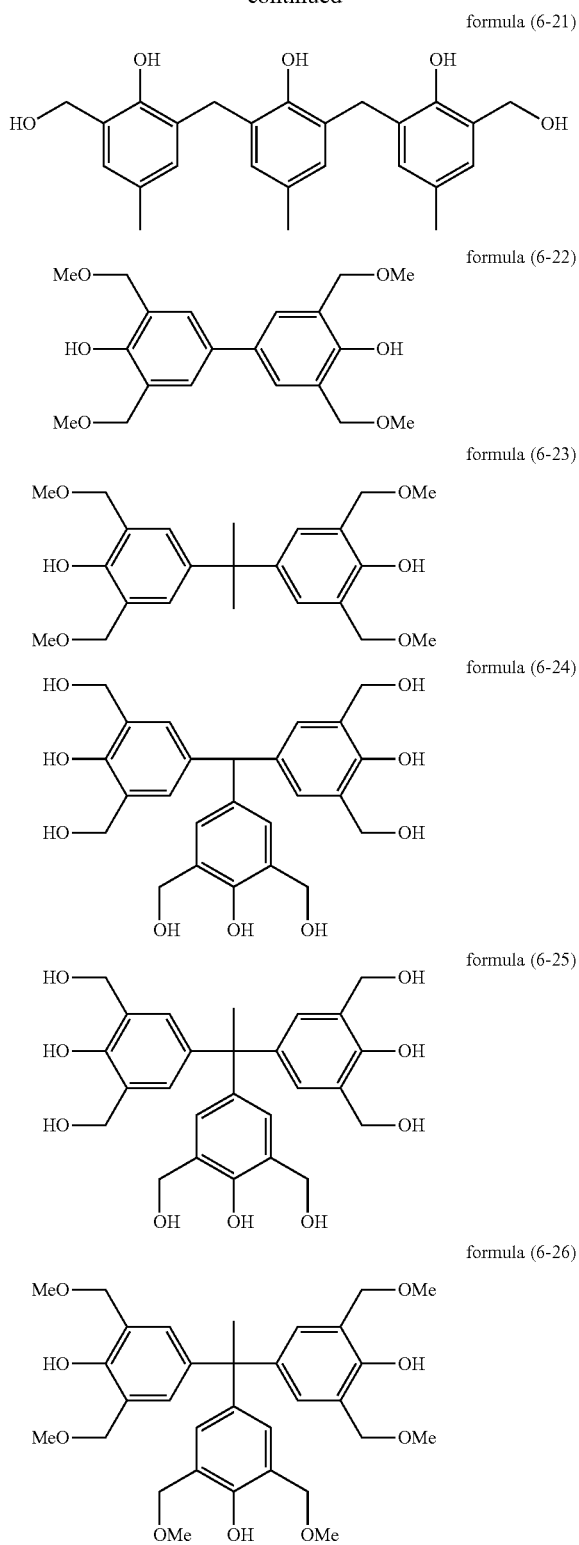

The above-mentioned compounds are available as products of Asahi Yukizai Corporation and Honshu Chemical Industry Co., Ltd. For example, among the above-mentioned crosslinking agents, the compound of formula (6-22) is available under the trade name: TMOM-BP, manufactured by Asahi Yukizai Corporation.

Crosslinking Catalyst

The protective film forming composition of the present invention may contain, as an optional component, a crosslinking catalyst for accelerating the crosslinking reaction. As the crosslinking catalyst, an acidic compound, a basic compound, or a compound capable of generating an acid or a base due to heat, but preferred is a crosslinking acid catalyst may be used. As the acidic compound, a sulfonic acid compound or a carboxylic acid compound may be used, and, as the compound capable of generating an acid due to heat, a thermal acid generator may be used.

Examples of sulfonic acid compounds or carboxylic acid compounds include p-toluenesulfonic acid, trifluoromethanesulfonic acid, pyridinium trifluoromethanesulfonate, pyridinium p-toluenesulfonate, salicylic acid, camphorsulfonic acid, 5-sulfosalicylic acid, 4-chlorobenzenesulfonic acid, 4-hydroxybenzenesulfonic acid, pyridinium 4-hydroxybenzenesulfonate, benzenedisulfonic acid, 1-naphthalenesulfonic acid, 4-nitrobenzenesulfonic acid, citric acid, benzoic acid, and hydroxybenzoic acid.

Examples of thermal acid generators include K-PURE® CXC-1612, K-PURE CXC-1614, K-PURE TAG-2172, K-PURE TAG-2179, K-PURE TAG-2678, K-PURE TAG2689 (each of which is manufactured by King Industries, Inc.), and SI-45, SI-60, SI-80, SI-100, SI-110, SI-150 (each of which is manufactured by Sanshin Chemical Industry Co., Ltd.).

These crosslinking catalysts may be used each alone or in combination. Further, as the basic compound, an amine compound or an ammonium hydroxide compound may be used, and, as the compound capable of generating a base due to heat, urea may be used.

Examples of amine compounds include tertiary amines, such as triethanolamine, tributanolamine, trimethylamine, triethylamine, trinormalpropylamine, triisopropylamine, trinormalbutylamine, tri-tert-butylamine, trinormaloctylamine, triisopropanolamine, phenyldiethanolamine, stearyldiethanolamine, and diazabicyclooctane, and aromatic amines, such as pyridine and 4-dimethylaminopyridine. Further examples of amine compounds include primary amines, such as benzylamine and normalbutylamine, and secondary amines, such as diethylamine and dinormalbutylamine. These amine compounds may be used each alone or in combination.

Examples of ammonium hydroxide compounds include tetramethylammonium hydroxide, tetraethylammonium hydroxide, tetrapropylammonium hydroxide, tetrabutylammonium hydroxide, benzyltrimethylammonium hydroxide, benzyltriethylammonium hydroxide, cetyltrimethylammonium hydroxide, phenyltrimethylammonium hydroxide, and phenyltriethylammonium hydroxide.

As the compound capable of generating a base due to heat, for example, a compound which has a thermally unstable group, such as an amide group, an urethane group, or an aziridine group, so that it forms an amine by heating it, may be used. Further examples of the compounds capable of generating a base due to heat include urea, benzyltrimethylammonium chloride, benzyltriethylammonium chloride, benzyldimethylphenylammonium chloride, benzyldodecyldimethylammonium chloride, benzyltributylammonium chloride, and choline chloride.

When the protective film forming composition contains a crosslinking catalyst, the amount of the crosslinking catalyst contained ranges 0.0001 to 20% by weight, preferably 0.01 to 15% by weight, further preferably 0.1 to 10% by mass, based on the weight of the solid of the protective film forming composition.

Surfactant

The protective film forming composition of the present invention may contain, as an optional component, a surfactant for improving the application properties with respect to a semiconductor substrate. Examples of the surfactants include nonionic surfactants, e.g., polyoxyethylene alkyl ethers, such as polyoxyethylene lauryl ether, polyoxyethylene stearyl ether, polyoxyethylene cetyl ether, and polyoxyethylene oleyl ether; polyoxyethylene alkyl aryl ethers, such as polyoxyethylene octyl phenyl ether and polyoxyethylene nonyl phenyl ether; polyoxyethylene-polyoxypropylene block copolymers; sorbitan fatty acid esters, such as sorbitan monolaurate, sorbitan monopalmitate, sorbitan monostearate, sorbitan monooleate, sorbitan trioleate, and sorbitan tristearate; and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorine surfactants, such as EFTOP® EF301, EFTOP EF303, EFTOP EF352 (manufactured by Mitsubishi Materials Electronic Chemicals Co., Ltd.), MEGAFACE® F171, MEGAFACE F173, MEGAFACE R-30, MEGAFACE R-30N, MEGAFACE R-40, MEGAFACE R-40-LM (manufactured by DIC Corporation), Fluorad FC430, Fluorad FC431 (manufactured by Sumitomo 3M), and AsahiGuard® AG710, Surflon® S-382, Surflon SC101, Surflon SC102, Surflon SC103, Surflon SC104, Surflon SC105, Surflon SC106 (manufactured by Asahi Glass Co., Ltd.), and organosiloxane polymer KP341 (manufactured by Shin-Etsu Chemical Co., Ltd.). These surfactants may be used each alone or in combination. When the protective film forming composition contains a surfactant, the amount of the surfactant contained ranges 0.0001 to 10% by weight, preferably 0.01 to 5% by weight, based on the weight of the solid of the protective film forming composition.

Solvent

The protective film forming composition of the present invention may be prepared by dissolving the above-mentioned components in an organic solvent, and is used in a uniform solution state.

With respect to the solvent for the protective film forming composition of the present invention, there is no particular limitation as long as it is a solvent which can dissolve therein the compound containing in the molecule thereof at least a pair of two hydroxy groups adjacent to each other, or a polymer thereof, and any of such solvents may be used. Particularly, the protective film forming composition of the present invention is used in a uniform solution state, and therefore, taking the application properties of the composition into consideration, it is recommended that a solvent generally used in a lithography process should be used.

Examples of the organic solvents include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monoethyl ether, propylene glycol monomethyl ether acetate, propylene glycol propyl ether acetate, toluene, xylene, methyl ethyl ketone, methyl isobutyl ketone, cyclopentanone, cyclohexanone, cycloheptanone, 4-methyl-2-pentanol, methyl 2-hydroxyisobutyrate, ethyl 2-hydroxyisobutyrate, ethyl ethoxyacetate, 2-hydroxyethyl acetate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 2-heptanone, methoxycyclopentane, anisole, γ-butyrolactone, N-methylpyrrolidone, N,N-dimethylformamide, and N,N-dimethylacetamide. These solvents may be used each alone or in combination.

Of these solvents, preferred are propylene glycol monomethyl ether, propylene glycol monomethyl ether acetate, ethyl lactate, butyl lactate, and cyclohexanone. Especially preferred are propylene glycol monomethyl ether and propylene glycol monomethyl ether acetate.

Other Components

In the protective film forming composition of the present invention, for example, a light absorber, a rheology modifier, or a bonding auxiliary may be added. The rheology modifier is effective in improving the fluidity of the protective film forming composition. The bonding auxiliary is effective in improving the adhesion between a semiconductor substrate or a resist and the resist underlying film.

With respect to the light absorber, for example, a commercially available light absorber described in "Kougyo-you Shikiso no Gijutsu to Shijou (Techniques and Markets of Industrial Dyes)" (CMC Publishing Co., Ltd.) or "Senryo Binran (Dye Handbook)" (edited by The Society of Synthetic Organic Chemistry, Japan), for example, C. I. Disperse Yellow 1, 3, 4, 5, 7, 8, 13, 23, 31, 49, 50, 51, 54, 60, 64, 66, 68, 79, 82, 88, 90, 93, 102, 114, and 124; C. I. Disperse Orange 1, 5, 13, 25, 29, 30, 31, 44, 57, 72, and 73; C. I. Disperse Red 1, 5, 7, 13, 17, 19, 43, 50, 54, 58, 65, 72, 73, 88, 117, 137, 143, 199, and 210; C. I. Disperse Violet 43; C. I. Disperse Blue 96; C. I. Fluorescent Brightening Agent 112, 135, and 163; C. I. Solvent Orange 2 and 45; C. I. Solvent Red 1, 3, 8, 23, 24, 25, 27, and 49; C. I. Pigment Green 10; and C. I. Pigment Brown 2 may be preferably used. The light absorber is incorporated usually in an amount of 10% by mass or less, preferably 5% by mass or less, based on the mass of the solid of the protective film forming composition.

A rheology modifier is added mainly for the purpose of improving the fluidity of the protective film forming composition, particularly for improving the uniformity of the thickness of the resist underlying film or the filling of the inside of hole with the protective film forming composition in the baking step. Specific examples of rheology modifiers include phthalic acid derivatives, such as dimethyl phthalate, diethyl phthalate, diisobutyl phthalate, dihexyl phthalate, and butylisodecyl phthalate; adipic acid derivatives, such as dinormalbutyl adipate, diisobutyl adipate, diisooctyl adipate, and octyldecyl adipate; maleic acid derivatives, such as dinormalbutyl maleate, diethyl maleate, and dinonyl maleate; oleic acid derivatives, such as methyl oleate, butyl oleate, and tetrahydrofurfuryl oleate; and stearic acid derivatives, such as normalbutyl stearate and glyceryl stearate. The rheology modifier is incorporated usually in an amount of less than 30% by mass, based on the mass of the solid of the protective film forming composition.

A bonding auxiliary is added mainly for the purpose of improving the adhesion between a substrate or a resist and the protective film forming composition to prevent the resist from peeling off particularly in the development. Specific examples of bonding auxiliaries include chlorosilanes, such as trimethylchlorosilane, dimethylmethylolchlorosilane, methyldiphenylchlorosilane, and chloromethyldimethylchlorosilane; alkoxysilanes, such as trimethylmethoxysilane, dimethyldiethoxysilane, methyldimethoxysilane, dimethylmethylolethoxysilane, diphenyldimethoxysilane, and phenyltriethoxysilane; silazanes, such as hexamethyldisilazane, N,N'-bis(trimethylsilyl)urea, dimethyltrimethylsilylamine, and trimethylsilylimidazole; silanes, such as methyloltrichlorosilane, γ-chloropropyltrimethoxysilane, γ-aminopropyltriethoxysilane, and γ-glycidoxypropyltrimethoxysilane; heterocyclic compounds, such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine; and urea or thiourea compounds, such as 1,1-dimethylurea and 1,3-dimethylurea. The bonding auxiliary is incorporated usually in an amount of less than 5% by mass, preferably less than 2% by mass, based on the mass of the solid of the protective film forming composition.

Protective Film Forming Composition

The protective film forming composition of the present invention generally has a solid content of 0.1 to 70% by mass, preferably 0.1 to 60% by mass. The solid content indicates a content of the solid remaining after removing the solvent from the all components of the protective film forming composition. The proportion of the polymer in the solid is 1 to 100% by mass, 1 to 99.9% by mass, 50 to 99.9% by mass, 50 to 95% by mass, and 50 to 90% by mass with increasing preference.

Method for Producing a Substrate Having a Resist Pattern and Method for Producing a Semiconductor Device Hereinbelow, a method for producing a substrate having a resist pattern and a method for producing a semiconductor device, each using the protective film forming composition of the present invention, will be described.

The substrate having a resist pattern in the present invention may be produced by applying the above-described protective film forming composition onto a semiconductor substrate and baking the applied composition.

Examples of semiconductor substrates to which the protective film forming composition of the present invention is applied include a silicon wafer, a germanium wafer, and compound semiconductor wafers, such as gallium arsenide, indium phosphide, gallium nitride, indium nitride, and aluminum nitride.

When a semiconductor substrate having an inorganic film formed on the surface thereof is used, the inorganic film is formed by, for example, an ALD (atomic layer deposition) method, a CVD (chemical vapor deposition) method, a reactive sputtering method, an ion plating method, a vacuum deposition method, or a spin coating method (spin on glass: SOG). Examples of the inorganic films include a polysilicon film, a silicon oxide film, a silicon nitride film, a BPSG (Boro-Phospho Silicate Glass) film, a titanium nitride film, a titanium nitride oxide film, a tungsten film, a gallium nitride film, and a gallium arsenide film.

The protective film forming composition of the present invention is applied onto the above-mentioned semiconductor substrate by an appropriate application method, such as a spinner or a coater. Then, the applied composition is baked using a heating means, such as a hotplate, to form a protective film. The conditions for baking are appropriately selected from those at a baking temperature of 100 to 400° C. for a baking time of 0.3 to 60 minutes. Preferred conditions for baking are those at a baking temperature of 120 to 350° C. for a baking time of 0.5 to 30 minutes, and more preferred conditions are those at a baking temperature of 150 to 300° C. for a baking time of 0.8 to 10 minutes. The thickness of the formed protective film ranges, for example, 0.001 to 10 μm, preferably 0.002 to 1 μm, more preferably 0.005 to 0.5 μm. When the temperature during the baking is lower than the above range, it is likely that crosslinking unsatisfactorily proceeds, making it difficult to obtain a resistance of the formed protective film to a resist solvent or a basic aqueous hydrogen peroxide solution. To the contrary, when the temperature during the baking is higher than the above range, the resultant protective film is likely to suffer decomposition due to heat.

Exposure through a mask (reticle) for forming a predetermined pattern is conducted, and, for example, an i-line, a KrF excimer laser, an ArF excimer laser, an EUV (extreme ultraviolet light), or an EB (electron beam) is used. In development, an alkaline developer is used, and the conditions are appropriately selected from those at a development temperature of 5 to 50° C. for a development time of 10 to 300 seconds. A usable alkaline developer includes, for example, an aqueous solution of an alkali, e.g., an inorganic alkali, such as sodium hydroxide, potassium hydroxide, sodium carbonate, sodium silicate, sodium metasilicate, or aqueous ammonia; a primary amine, such as ethylamine or n-propylamine; a secondary amine, such as diethylamine or di-n-butylamine; a tertiary amine, such as triethylamine or methyldiethylamine; an alcohol amine, such as dimethylethanolamine or triethanolamine; a quaternary ammonium salt, such as tetramethylammonium hydroxide, tetraethylammonium hydroxide, or choline; or a cyclic amine, such as pyrrole or piperidine. Further, the above-mentioned aqueous alkali solution which has added thereto an alcohol, such as isopropyl alcohol, or a surfactant, such as a nonionic surfactant, in an appropriate amount, may also be used. Of these, a preferred developer is a quaternary ammonium salt, and further preferred are tetramethylammonium hydroxide and choline. Further, for example, a surfactant may be added to the above developer. Instead of the method using an alkaline developer, there may be used a method in which development is conducted using an organic solvent, such as butyl acetate, to develop a portion of the photoresist in which the alkali dissolution rate is not improved.

Then, using the formed resist pattern as a mask, the protective film is subjected to dry etching. In this instance, when the above-mentioned inorganic film is formed on the surface of the semiconductor substrate used, the surface of the inorganic film is exposed, and, when the inorganic film is not formed on the surface of the semiconductor substrate used, the surface of the semiconductor substrate is exposed.

Further, using the protective film obtained after dry etching (including the resist pattern in the case where the resist pattern remains on the protective film) as a mask, the resultant substrate is subjected to wet etching using a wet etching liquid for semiconductor, forming a desired pattern.

With respect to the wet etching liquid for semiconductor, a general chemical liquid for etching a wafer for semiconductor may be used, and, for example, any of a substance exhibiting acidic property and a substance exhibiting basic property may be used.

Examples of substances exhibiting acidic property include hydrogen peroxide, hydrofluoric acid, ammonium fluoride, acidic ammonium fluoride, ammonium hydrogenfluoride, buffered hydrofluoric acid, hydrochloric acid, nitric acid, sulfuric acid, phosphoric acid, and a mixture thereof.

Examples of substances exhibiting basic property include a basic aqueous hydrogen peroxide solution obtained by mixing ammonia, sodium hydroxide, potassium hydroxide, sodium cyanide, potassium cyanide, or an organic amine, such as triethanolamine, with an aqueous hydrogen peroxide solution so that the pH of the resultant solution becomes on the basic side. A specific example includes SC-1 (ammoniahydrogen peroxide solution). In addition, as a chemical liquid for wet etching, there may be used a mixture of an aqueous hydrogen peroxide solution and a substance capable of making the pH be on the basic side, for example, urea such that the mixture is heated to cause urea to suffer thermal decomposition, generating ammonia, so that the pH of the resultant solution is eventually on the basic side.

Among these, preferred is an acidic aqueous hydrogen peroxide solution or a basic aqueous hydrogen peroxide solution, and especially preferred is a basic aqueous hydrogen peroxide solution.

These chemical liquids may contain an additive, such as a surfactant.

The temperature at which the wet etching liquid for semiconductor is used ranges desirably 25 to 90° C., further desirably 40 to 80° C. The wet etching time ranges desirably 0.5 to 30 minutes, further desirably 1 to 20 minutes.

EXAMPLES

Hereinbelow, the present invention will be described in more detail with reference to the following Examples and others, which should not be construed as limiting the scope of the present invention.

The apparatus and other conditions used in the measurement of the weight average molecular weight of the polymers obtained in the following synthesis Examples are shown below.
Apparatus: HLC-8320GPC, manufactured by Tosoh Corp.
GPC Column: Shodex®-Asahipak® (Showa Denko K.K.)
Column temperature: 40° C.
Flow rate: 0.6 mL/minute
Eluent: N,N-Dimethylformamide (DMF)
Standard sample: Polystyrene (Tosoh Corp.)

Example 1

A solution containing 16.00 g of glycidyl methacrylate, 4.53 g of 2,2'-azobis(isobutyronitrile), and 65.68 g of propylene glycol monomethyl ether was placed in a dropping funnel. The solution was dropwise added to a reaction flask containing therein 16.48 g of propylene glycol monomethyl ether in a nitrogen gas atmosphere at 100° C., and the resultant mixture was heated while stirring for 13 hours. To 30.00 g of the resultant solution (epoxy value: 676 g/eq) were added 5.72 g of piperonylic acid, 0.32 g of ethyltriphenylphosphonium bromide, and 20.04 g of propylene glycol monomethyl ether, and the resultant mixture was heated under reflux in a nitrogen gas atmosphere while stirring for 20 hours. To the resultant solution were added 11 g of a cation-exchange resin (product name: Dowex® 550A, Muromachi Technos Co., Ltd.) and 11 g of an anionexchange resin (product name: Amberlite® 15JWET, Organo Corporation), and the solution was subjected to ion-exchange treatment at room temperature for 4 hours.

The ion-exchange resins were separated to obtain a solution of a resin which corresponds to formula (X-1). The resin had a weight average molecular weight Mw of 4,100, as determined by GPC using a conversion calibration curve obtained from the standard polystyrene.

[Chemical formula 21]

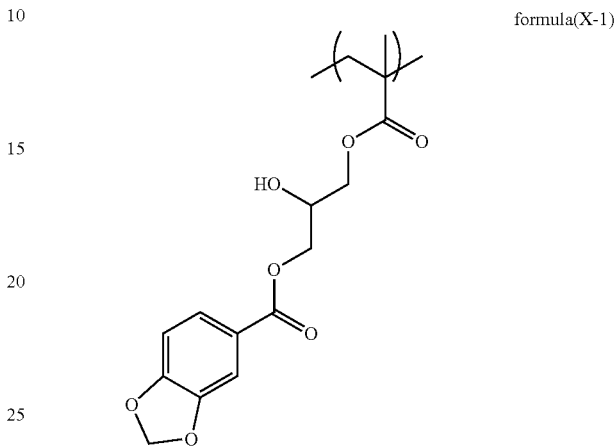

formula(X-1)

To 4.59 g of the obtained resin solution (having a solid content of 17.93% by weight) were added 0.21 g of 3,3',5,5'-tetrakis(methoxymethyl)-4,4'-dihydroxybiphenyl (product name: TMOM-BP, manufactured by Honshu Chemical Industry Co., Ltd.) as a crosslinking agent, 0.02 g of K-PURE TAG-2689 (manufactured by King Industries, Inc.) as a crosslinking acid catalyst, 0.001 g of a surfactant (product name: MEGAFACE® R-40, manufactured by DIC Corporation; fluorine surfactant), 8.79 g of propylene glycol monomethyl ether, and 1.40 g of propylene glycol monomethyl ether acetate to prepare a protective film forming composition in the form of a solution.

Example 2

A solution containing 5.50 g of glycerol monomethacrylate (product name: BLEMMER GLM, manufactured by NOF Corporation), 5.09 g of 5-vinylbenzo[d][1,3]dioxole (manufactured by Cool Pharm LTD.), 0.66 g of 2,2'-azobis (isobutyronitrile), and 35.99 g of propylene glycol monomethyl ether was placed in a dropping funnel. The solution was dropwise added to a reaction flask containing therein 9.00 g of propylene glycol monomethyl ether in a nitrogen gas atmosphere at 100° C., and the resultant mixture was heated while stirring for 17 hours. To the resultant solution were added 11 g of a cation-exchange resin (product name: Dowex® 550A, Muromachi Technos Co., Ltd.) and 11 g of an anion-exchange resin (product name: Amberlite® 15JWET, Organo Corporation), and the solution was subjected to ion-exchange treatment at room temperature for 4 hours. The ion-exchange resins were separated to obtain a solution of a resin which corresponds to formula (X-2). The resin had a weight average molecular weight Mw of 10,800, as determined by GPC using a conversion calibration curve obtained from the standard polystyrene.

[Chemical formula 22]

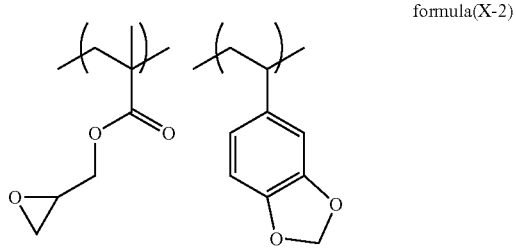

formula(X-2)

To 5.10 g of the obtained resin solution (having a solid content of 16.12% by weight) were added 0.21 g of 3,3',5,5'-tetrakis(methoxymethyl)-4,4'-dihydroxybiphenyl (product name: TMOM-BP, manufactured by Honshu Chemical Industry Co., Ltd.) as a crosslinking agent, 0.02 g of K-PURE TAG-2689 (manufactured by King Industries, Inc.) as a crosslinking acid catalyst, 0.001 g of a surfactant (product name: MEGAFACE® R-40, manufactured by DIC Corporation; fluorine surfactant), 8.27 g of propylene glycol monomethyl ether, and 1.40 g of propylene glycol monomethyl ether acetate to prepare a protective film forming composition in the form of a solution.

Example 3

A solution containing 5.00 g of glycidyl methacrylate, 5.21 g of 5-vinylbenzo[d][1,3]dioxole (manufactured by Cool Pharm LTD.), 0.58 g of 2,2'-azobis(isobutyronitrile), and 34.53 g of propylene glycol monomethyl ether was placed in a dropping funnel. The solution was dropwise added to a reaction flask containing therein 8.63 g of propylene glycol monomethyl ether in a nitrogen gas atmosphere at 100° C., and the resultant mixture was heated while stirring for 20 hours. To the resultant solution were added 11 g of a cation-exchange resin (product name: Dowex® 550A, Muromachi Technos Co., Ltd.) and 11 g of an anion-exchange resin (product name: Amberlite® 15JWET, Organo Corporation), and the solution was subjected to ion-exchange treatment at room temperature for 4 hours. The ion-exchange resins were separated to obtain a solution of a resin which corresponds to formula (X-3). The resin had a weight average molecular weight Mw of 9,000, as determined by GPC using a conversion calibration curve obtained from the standard polystyrene.

[Chemical formula 23]

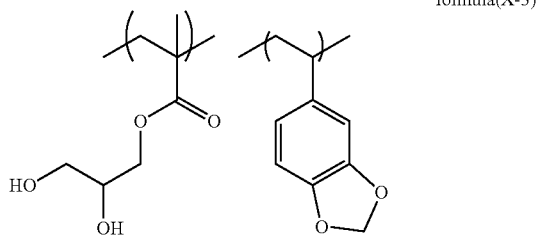

formula(X-3)

To 4.74 g of the obtained resin solution (having a solid content of 17.35% by weight) were added 0.21 g of 3,3',5,5'-tetrakis(methoxymethyl)-4,4'-dihydroxybiphenyl (product name: TMOM-BP, manufactured by Honshu Chemical Industry Co., Ltd.) as a crosslinking agent, 0.02 g of K-PURE TAG-2689 (manufactured by King Industries, Inc.) as a crosslinking acid catalyst, 0.001 g of a surfactant (product name: MEGAFACE® R-40, manufactured by DIC Corporation; fluorine surfactant), 8.64 g of propylene glycol monomethyl ether, and 1.40 g of propylene glycol monomethyl ether acetate to prepare a protective film forming composition in the form of a solution.

Comparative Example 1

To 0.82 g of polyparahydroxystyrene (product name: VP-8000, manufactured by Nippon Soda Co., Ltd.) were added 0.21 g of 3,3',5,5'-tetrakis(methoxymethyl)-4,4'-dihydroxybiphenyl (product name: TMOM-BP, manufactured by Honshu Chemical Industry Co., Ltd.) as a crosslinking agent, 0.02 g of K-PURE TAG-2689 (manufactured by King Industries, Inc.) as a crosslinking acid catalyst, 0.001 g of a surfactant (product name: MEGAFACE [trade name] R-40, manufactured by DIC Corporation; fluorine surfactant), 12.56 g of propylene glycol monomethyl ether, and 1.40 g of propylene glycol monomethyl ether acetate to prepare a protective film forming composition in the form of a solution.

Comparative Example 2

A solution containing 14.00 g of 4-hydroxyphenyl methacrylate (product name: PQMA, manufactured by Showa Denko K.K.), 1.13 g of 2,2'-azobis(isobutyronitrile), and 42.37 g of propylene glycol monomethyl ether was placed in a dropping funnel. The solution was dropwise added to a reaction flask containing therein 18.16 g of propylene glycol monomethyl ether in a nitrogen gas atmosphere at 100° C., and the resultant mixture was heated while stirring for 14 hours. To the resultant solution were added 15 g of a cation-exchange resin (product name: Dowex® 550A, Muromachi Technos Co., Ltd.) and 15 g of an anion-exchange resin (product name: Amberlite® 15JWET, Organo Corporation), and the solution was subjected to ion-exchange treatment at room temperature for 4 hours. The ion-exchange resins were separated to obtain a solution of a resin which corresponds to formula (Y-1). The resin had a weight average molecular weight Mw of 11,000, as determined by GPC using a conversion calibration curve obtained from the standard polystyrene.

[Chemical formula 24]

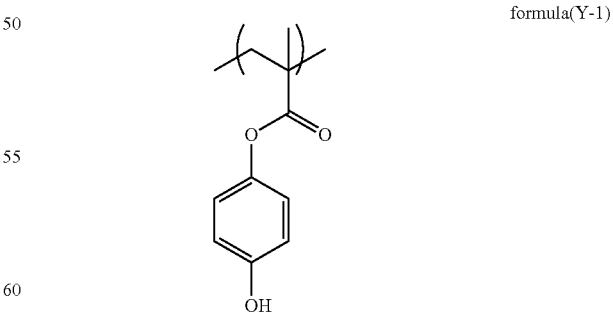

formula(Y-1)

To 4.47 g of the obtained resin solution (having a solid content of 18.41% by weight) were added 0.21 g of 3,3',5, 5'-tetrakis(methoxymethyl)-4,4'-dihydroxybiphenyl (product name: TMOM-BP, manufactured by Honshu Chemical Industry Co., Ltd.) as a crosslinking agent, 0.02 g of K-PURE TAG-2689 (manufactured by King Industries, Inc.) as a crosslinking acid catalyst, 0.001 g of a surfactant (product name: MEGAFACE [trade name] R-40, manufactured by DIC Corporation; fluorine surfactant), 8.91 g of propylene glycol monomethyl ether, and 1.40 g of propylene glycol monomethyl ether acetate to prepare a protective film forming composition in the form of a solution.

Comparative Synthesis Example 3

A solution containing 16.00 g of glycidyl methacrylate, 4.53 g of 2,2'-azobis(isobutyronitrile), and 65.68 g of propylene glycol monomethyl ether was placed in a dropping funnel. The solution was dropwise added to a reaction flask containing therein 16.48 g of propylene glycol monomethyl ether in a nitrogen gas atmosphere at 100° C., and the resultant mixture was heated while stirring for 13 hours. To 30.00 g of the resultant solution (epoxy value: 676 g/eq) were added 5.31 g of 3,4-dihydroxybenzoic acid, 0.20 g of benzyltriethylammonium chloride, and 17.89 g of propylene glycol monomethyl ether, and the resultant mixture was heated under reflux in a nitrogen gas atmosphere while stirring for 20 hours. To the resultant solution were added 11 g of a cation-exchange resin (product name: Dowex® 550A, Muromachi Technos Co., Ltd.) and 11 g of an anion-exchange resin (product name: Amberlite® 15JWET, Organo Corporation), and the solution was subjected to ion-exchange treatment at room temperature for 4 hours. The ion-exchange resins were separated to obtain a solution of a resin which corresponds to formula (Y-2). The resin had a weight average molecular weight Mw of 24,400, as determined by GPC using a conversion calibration curve obtained from the standard polystyrene.

[Chemical formula 25]

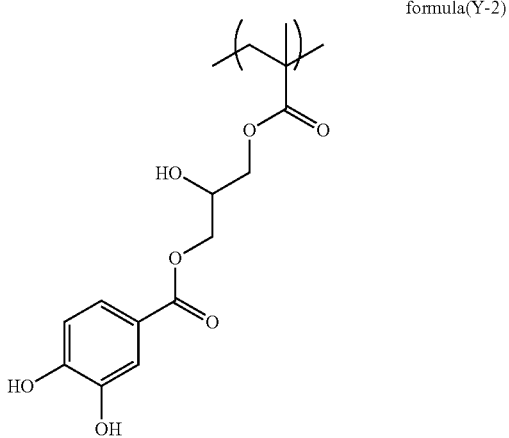

formula(Y-2)

To 4.47 g of the obtained resin solution (having a solid content of 19.51% by weight) were added 0.21 g of 3,3',5,5'-tetrakis(methoxymethyl)-4,4'-dihydroxybiphenyl (product name: TMOM-BP, manufactured by Honshu Chemical Industry Co., Ltd.) as a crosslinking agent, 0.02 g of K-PURE TAG-2689 (manufactured by King Industries, Inc.) as a crosslinking acid catalyst, 0.001 g of a surfactant (product name: MEGAFACE [trade name] R-40, manufactured by DIC Corporation; fluorine surfactant), 9.16 g of propylene glycol monomethyl ether, and 1.40 g of propylene glycol monomethyl ether acetate to prepare a protective film forming composition in the form of a solution.

Test for Resist Solvent Resistance

Each of the protective film forming compositions prepared in Examples 1 to 3 and Comparative Examples 1 to 3 was applied onto a silicon wafer using a spin coater (spin coating). After the application, the silicon wafer was heated on a hotplate at 215° C. for one minute to form a film (protective film) having a thickness of 200 nm. Then, for evaluating the resist solvent resistance of the protective film, the silicon wafer having the protective film formed thereon was immersed in a mixed solvent of propylene glycol monomethyl ether and propylene glycol monomethyl ether acetate in a weight ratio of 7:3 for one minute, and subjected to spin drying and then baked at 100° C. for 30 seconds. The thickness of the protective film before and after the immersion in the mixed solvent was measured by means of an interference thickness meter.

A resist solvent resistance was evaluated as follows. From the equation: ((Thickness of the film before the immersion in the solvent)−(Thickness of the film after the immersion in the solvent))÷(Thickness of the film before the immersion in the solvent)×100, the thickness reduction ratio (%) of the protective film removed by immersion in the solvent was calculated to evaluate the resist solvent resistance. A thickness reduction ratio of about 1% or less is in the acceptable range.

TABLE 1

| Example | Thickness reduction ratio |
|---|---|
| Example 1 | 0.5% |
| Example 2 | 0.1% |
| Example 3 | 0.1% |
| Comparative Example 1 | 0.1% |
| Comparative Example 2 | 0.1% |
| Comparative Example 3 | 0.2% |

As apparent from the above results, the films in Examples 1 to 3 and Comparative Examples 1 to 3 exhibited so excellent resist solvent resistance that, after the film was immersed in the resist solvent, the change of the thickness was very small. Thus, the films in all these examples have such a satisfactory resist solvent resistance that the film can function as a protective film.

Test for Resistance to a Basic Aqueous Hydrogen Peroxide Solution

The resistance to a basic aqueous hydrogen peroxide solution was evaluated as follows. Each of the protective film forming compositions prepared in Examples 1 to 3 and Comparative Examples 1 to 3, which exhibited excellent resist solvent resistance in the above-mentioned test for resist solvent resistance, was applied to a 50 nm-thick TiN deposited substrate, and heated at 215° C. for one minute to form a film having a thickness of 200 nm. Thereafter, a basic aqueous hydrogen peroxide solution was prepared by mixing 28% aqueous ammonia, 33% hydrogen peroxide, and water in a weight ratio of 1:1:2. The TiN deposited substrate having the protective film forming composition applied thereto was immersed in the prepared basic aqueous hydrogen peroxide solution heated to 50° C., and the period of time required for peeling off the protective film from the substrate from the time immediately after the immersion of the substrate in the solution was measured. The results are shown in Table 2.

TABLE 2

| Example | Time required until peeling |
|---|---|
| Example 1 | 390 Sec. |
| Example 2 | 350 Sec. |
| Example 3 | 588 Sec. |
| Comparative Example 1 | 121 Sec. |
| Comparative Example 2 | 214 Sec. |
| Comparative Example 3 | 310 Sec. |

As apparent from the above results, when immersed in the basic aqueous hydrogen peroxide solution, the films in Examples 1 to 3 were unlikely to be peeled off from the substrate, as compared to the films in Comparative Examples 1 to 3. That is, the films in Examples 1 to 3 exhibited higher chemical resistance to the basic aqueous hydrogen peroxide solution than that in Comparative Examples 1 to 3, and thus are advantageously used as a protective film against a basic aqueous hydrogen peroxide solution.

INDUSTRIAL APPLICABILITY

In the present invention, there can be provided a composition for forming a protective film which has excellent resistance to a basic aqueous hydrogen peroxide solution for use in RCA cleaning in a lithography process in the production of a semiconductor.

The invention claimed is:

1. A composition for forming a protective film against a wet etching liquid for semiconductor, the protective film forming composition comprising a solvent and a compound containing in the molecule thereof at least one acetal structure that protects adjacent hydroxy groups in the molecule, or a polymer thereof.

2. The protective film forming composition according to claim 1, wherein adjacent hydroxy groups are in an aromatic group of the molecule.

3. The protective film forming composition according to claim 1, wherein the compound has a partial structure represented by the following formula (1):

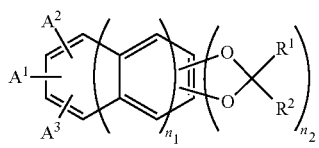

formula (1)

wherein:
each of $R^1$ and $R^2$ represents a hydrogen atom, or an alkyl group having 1 to 10 carbon atoms or an aryl group having 6 to 40 carbon atoms, each of the group optionally being substituted,
$n_1$ is 0, 1, or 2,
$n_2$ is 1 or 2,
$A^1$ represents a hydrogen atom or a hydroxy group,
$A^2$ represents a —CH($R^0$)-$A^4$ group,
$R^0$ represents a hydrogen atom, a phenyl group optionally substituted with 1 to 3 hydroxy groups, or a benzodioxole group, and
$A^3$ and $A^4$ are the same or different and each represents a monovalent organic group.

4. The protective film forming composition according to claim 3, wherein, in formula (1), $n_1$ is 0, and $n_2$ is 1.

5. The protective film forming composition according to claim 3, wherein, in formula (1), $R^1$ and $R^2$ are the same or different and a hydrogen atom or a methyl group.

6. The protective film forming composition according to claim 3, wherein, in formula (1), $R^1$ and $R^2$ are a hydrogen atom.

7. The protective film forming composition according to claim 1, further comprising a crosslinking catalyst.

8. The protective film forming composition according to claim 1, further comprising a crosslinking agent.

9. The protective film forming composition according to claim 1, further comprising a surfactant.

10. A protective film which is a baked product of an applied film of the protective film forming composition according to claim 1.

11. A method for producing a substrate having a resist pattern, comprising the steps of applying the protective film forming composition according to claim 1 onto a semiconductor substrate and baking the applied composition to form a protective film as a resist underlying film, which is used for producing a semiconductor.

12. A method for producing a semiconductor device, comprising the steps of:
forming a protective film on a semiconductor substrate optionally having an inorganic film formed on the surface thereof using the composition according to claim 1 for forming a protective film against a wet etching liquid for semiconductor;
forming a resist pattern on the protective film;
subjecting the protective film to dry etching using the formed resist pattern as a mask so as to expose a surface of the inorganic film or the semiconductor substrate; and using the dry-etched protective film as a mask, subjecting the inorganic film or the semiconductor substrate to wet etching with a wet etching liquid for semiconductor and to washing.

* * * * *